United States Patent
Saiki et al.

(10) Patent No.: US 7,317,165 B2
(45) Date of Patent: Jan. 8, 2008

(54) INTERMEDIATE SUBSTRATE, INTERMEDIATE SUBSTRATE WITH SEMICONDUCTOR ELEMENT, SUBSTRATE WITH INTERMEDIATE SUBSTRATE, AND STRUCTURE HAVING SEMICONDUCTOR ELEMENT, INTERMEDIATE SUBSTRATE AND SUBSTRATE

(75) Inventors: Hajime Saiki, Niwa (JP); Kazuhiro Urashima, Konan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 252 days.

(21) Appl. No.: 10/874,531

(22) Filed: Jun. 24, 2004

(65) Prior Publication Data

US 2005/0023033 A1  Feb. 3, 2005

(30) Foreign Application Priority Data

Jun. 24, 2003  (JP)  .................... P. 2003-179722

(51) Int. Cl.
 *H05K 1/16* (2006.01)
(52) U.S. Cl. .................. 174/260; 257/787; 361/792
(58) Field of Classification Search ............. 174/260; 257/787–796; 361/792–795
 See application file for complete search history.

(56) References Cited

U.S. PATENT DOCUMENTS 5,039,628 A * 8/1991 Carey .................. 228/180.21
5,598,033 A * 1/1997 Behlen et al. .............. 257/686
6,163,462 A * 12/2000 Buck ......................... 361/767
6,335,491 B1   1/2002 Alagaratnam et al.
6,347,735 B1 * 2/2002 Frantz et al. .......... 228/180.22
6,461,896 B1 * 10/2002 Imasu et al. ................ 438/108
6,635,514 B1 * 10/2003 Fjelstad ...................... 438/126

FOREIGN PATENT DOCUMENTS

| JP | 06-275159 | * | 9/1994 |
| JP | 9-129679 | | 5/1997 |
| JP | 2000-77579 A | | 3/2000 |
| JP | 2000-208661 A | | 7/2000 |
| JP | 2001-298109 | | 10/2001 |

OTHER PUBLICATIONS

Machine translation of JP 06-275159.*

* cited by examiner

*Primary Examiner*—Jeremy C Norris
(74) *Attorney, Agent, or Firm*—Sughrue Mion, PLLC

(57) ABSTRACT

An intermediate substrate comprising: an intermediate substrate body containing an insulating material, and having a first face to be mounted with an semiconductor element and a second face opposing to said first face; and a semiconductor element mounting area including a plurality of first face terminals arranged on said first face, and being surrounded by an outermost periphery of said plurality of first face terminals, wherein a center of said semiconductor element mounting area is eccentric with respect to a center of said first face.

14 Claims, 8 Drawing Sheets

INTERMEDIATE SUBSTRATE, INTERMEDIATE SUBSTRATE WITH SEMICONDUCTOR ELEMENT, SUBSTRATE WITH INTERMEDIATE SUBSTRATE, AND STRUCTURE HAVING SEMICONDUCTOR ELEMENT, INTERMEDIATE SUBSTRATE AND SUBSTRATE

FIELD OF THE INVENTION

The present invention relates to an intermediate substrate, an intermediate substrate with a semiconductor element, a substrate with an intermediate substrate, and a structure having a semiconductor element, an intermediate substrate and a substrate.

BACKGROUND OF THE INVENTION

In recent years, there have been known a variety of structures (as referred to JP-A-2000-208661 (FIG. 2(d) and so on)), in which a wiring substrate (such as an IC chip mounting substrate or an IC package substrate) mounted with an IC chip and a printed circuit substrate such as a mother board are connected not directly but through an intermediate substrate called the "interposer" with each other.

Moreover, the IC chip to be used in the structure of that kind is generally formed of a semiconductor material (e.g., silicon) having a thermal expansion coefficient of about 2.0 ppm/° C. to 5.0 ppm/° C. On the other hand, the intermediate substrate and the wiring substrate are frequently formed of a resin material having a far larger thermal expansion coefficient.

At present, however, there is not known the structure, in which the intermediate substrate is interposed between the IC chip and the IC chip mounting substrate.

In order to realize the structure, in which the intermediate substrate is interposed between the IC chip and the IC chip mounting substrate, therefore, we have conceived of forming upper face pads for mounting the IC chip on the upper face of an intermediate substrate and forming lower face pads to be connected with the IC chip mounting substrate, on the lower face of the intermediate substrate. We also have conceived of providing a plurality of conductor columns extending in the thickness direction of the intermediate substrate thereby to connect and make conductive the upper face pad group and the lower face pad group directly through those conductor columns. We have further conceived of forming solder bumps, if necessary, over the upper face pads and the lower face pads.

SUMMARY OF THE INVENTION

In recent years, there is a trend of making the IC chip larger to form more operation circuits according to the higher speed of the IC chip. If the processing ability of the IC chip rises, however, the calorific power increases to increase the influences of a thermal stress gradually. When the IC chip is mounted on an IC chip mounting substrate or the IC package substrate, moreover, solder is generally used. When this solder is cooled from the melting point to the room temperature, the thermal stress occurs in the mounted portions due to the difference in the thermal expansion coefficients between the IC chip and the IC chip mounting substrate or the IC package substrate.

When the high thermal stress acts on the interface or the like between the IC chip and the intermediate substrate, moreover, a crack or the like may occur in the IC chip mounting portion (or the joint portion). Therefore, there arises a problem that a high connection reliability cannot be given between the IC chip and the intermediate substrate. Especially if any of the sides of the IC chip exceeds 10.0 mm, an especially high thermal stress may act to cause the crack or the like. If the IC chip has a thickness smaller than 1.0 mm, on the other hand, the strength may be weakened to cause the crack or the like. In these cases, therefore, the aforementioned problem becomes serious.

In the structure in which the intermediate substrate is interposed between the IC chip conceived by us and the IC chip mounting substrate, moreover, the IC chip is mounted with the solder on either the IC chip mounting substrate with the intermediate substrate or the IC chip substrate with the intermediate substrate. When the solder is then cooled from the melting point to the room temperature, the thermal stress also occurs between the intermediate substrate and the IC chip mounting substrate or the IC package substrate.

When the high thermal stress acts the interface or the like between the intermediate substrate and the IC chip mounting substrate or the IC package substrate, the crack or the like may occur in the joint portion between the intermediate substrate and the IC chip mounting substrate or the IC package substrate. Therefore, there arises a problem that a high connection reliability cannot be given between the intermediate substrate and the IC chip mounting substrate or the IC package substrate.

Therefore, we have conceived of filling the IC chip and the intermediate substrate inbetween with a resin filler so as to prevent the crack or the like from occurring in the joint portion between the IC chip and the intermediate substrate.

We have also conceived of filling the intermediate substrate and the IC chip mounting substrate or the IC package substrate inbetween with a resin filler so as to prevent the crack or the like from occurring from occurring between the intermediate substrate and the IC chip mounting substrate or the IC package substrate.

When the joint portion between the IC chip and the intermediate substrate is to be filled with the resin filler, however, this resin filler fails to fill up the IC chip and the intermediate substrate completely thereby to cause a drawback of forming a cavity. If the cavity thus occurs in the resin filler, it is impossible to prevent the crack or the like completely from occurring in the joint portion between the IC chip and the intermediate substrate.

The present invention has been conceived in view of the problems thus far described, and has an object to provide a substrate of an excellent connection reliability, which is constructed to include a semiconductor element, an intermediate substrate and a substrate. Another object of the invention is to provide an intermediate substrate, an intermediate substrate with a semiconductor element, and a substrate with an intermediate substrate, all of which are suitable for realizing the excellent substrate.

As means for solving the aforementioned problems, moreover, there is provided an intermediate substrate comprising:

an intermediate substrate body made of an insulating material, and having a first face to be mounted with an semiconductor element and a second face opposing to the first face; and a semiconductor element mounting area including a plurality of first face terminals arranged on the first face, wherein the center of the semiconductor element mounting area is eccentric with respect to the center of the first face.

Preferably, in the intermediate substrate, the center of the semiconductor element mounting area is positioned on a line extending through the center of the first face and parallel to any of the sides forming the first face, and is offset from the center of the first face.

There is further provided an intermediate substrate, comprising:

intermediate substrate body made of an insulating material, and having a first face to be mounted with an semiconductor element and a second face; and a semiconductor element mounting area including a plurality of first face terminals arranged on the first face, wherein, of the widths of the four planes which are formed around the semiconductor element mounting area and which are formed between the four sides to form the semiconductor element and the corresponding four sides to form the first face, the width of the plane for applying a resin filler to fill between a semiconductor element to be mounted and the intermediate substrate body is made larger than the widths of the individual planes adjacent and opposed to the plane.

Preferably, in the intermediate substrate, a plurality of second face terminals are so arranged in the second face that the positions of the second face terminals and the positions of the first face terminals conducting with the second face terminals are offset along the direction perpendicular to the thickness direction of the intermediate substrate body.

Preferably, in the intermediate substrate, the quantity of solder of second face solder bumps to be formed over the second face terminals is more than that of first face solder bumps to be formed over the first face terminals.

According to the solving means thus far described, the center of the semiconductor mounting area is located at a position offset from the center of the surface of the intermediate substrate body so that most sides of the area and the surface either are substantially identical or leave a narrow space inbetween. On the other hand, a relatively wide plane (or a free space) is formed between the surface on the side more distance from the center of the semiconductor element and the semiconductor mounting area. Therefore, the resin filler is once applied onto that free space and is then poured between and around the plural first face terminals in the semiconductor mounting area. As a result, the semiconductor element to be mounted in that area can be reliably filled therearound with the resin filler having no cavity.

Here, the semiconductor element mounting area indicates the area, which is surrounded by the outermost periphery of the plural first face terminals.

The plane, to which the resin filler for filling the space between the semiconductor element to be mounted and the intermediate substrate body is applied, is made wider than the planes of the three sides adjacent and opposed to that plane. Therefore, it is possible to retain the free space for allowing the resin filler to be applied, and to cause the resin filler to flow not along the aforementioned side of the first face but easily between the first face terminals.

In the structure, moreover, the first face terminals and the second face terminals made conductive with each other between the first face and the second face of the intermediate substrate body are displaced in the plane direction of the substrate body. Even if the facial connection terminals of the semiconductor element and the facial connection terminals of the substrate are arranged with a displacement along their planar direction, their connections can be reliably performed.

In addition, the quantities of the solder of the solder bumps to be formed over the first and second face terminals positioned on the first and second faces of the intermediate substrate body are made different, as described above, so that the solder can connect the facial connection terminals of different sizes and pitches easily.

As another means for solving the aforementioned problems, moreover, there is provided an intermediate substrate having a semiconductor element, comprising a semiconductor element having an intermediate substrate according to any of the intermediate substrates and facial connection terminals, wherein the intermediate substrate includes:

a substantially plate-shaped intermediate substrate body made of an insulating material, and having a first face to be mounted with the semiconductor element and a second face; and a plurality of first face terminals arranged on the side of the first face; a plurality of second face terminals arranged on the side of the second face; and conductor structures disposed in the intermediate substrate body for conducting the first face terminals and the second face terminals with each other, wherein the semiconductor element and the intermediate substrate body are filled inbetween with a resin filler, wherein two opposed ones of the sides perpendicular to the thickness direction of the semiconductor element have individual lengths substantially equal to or smaller within a range of 4 mm or less than that of such two ones of the sides perpendicular to the thickness direction of the intermediate substrate body as correspond to the opposed two sides of the semiconductor element, and wherein the remaining two opposed ones of the sides perpendicular to the thickness direction of the semiconductor element have individual lengths smaller by 4 mm or more than that of such two ones of the sides perpendicular to the thickness direction of the intermediate substrate body as correspond to the remaining opposed two sides of the semiconductor element.

As another means for solving the aforementioned problems, moreover, there is provided a substrate with an intermediate substrate having an intermediate substrate, comprising a substrate having an intermediate substrate according to any of the aforementioned intermediate substrates and facial connection pads, wherein the intermediate substrate includes:

a substantially plate-shaped intermediate substrate body made of an insulating material, and having a first face to be mounted with the semiconductor element and a second face to be mounted on the surface of the substrate; and a plurality of first face terminals arranged on the side of the first face; a plurality of second face terminals arranged on the side of the second face; and conductor structures disposed in the intermediate substrate body for conducting the first face terminals and the second face terminals with each other, wherein the substrate and the intermediate substrate body are filled inbetween with a resin filler, wherein two opposed ones of the sides perpendicular to the thickness direction of the semiconductor element to be mounted have individual lengths substantially equal to or smaller within a range of 4 mm or less than that of such two ones of the sides perpendicular to the thickness direction of the intermediate substrate body as correspond to the opposed two sides of the semiconductor element, and wherein the remaining two opposed ones of the sides perpendicular to the thickness direction of the semiconductor element to be mounted have individual lengths smaller by 4 mm or more than that of such two ones of the sides perpendicular to the thickness direction of the intermediate substrate body as correspond to the remaining opposed two sides of the semiconductor element.

As another means for solving the aforementioned problems, moreover, there is provided a structure having a semiconductor element, an intermediate substrate and a substrate, comprising: an intermediate substrate according to any of the intermediate substrates; a semiconductor element having facial connection terminals; and a substrate having facial connection pads, wherein the intermediate substrate includes:

a substantially plate-shaped intermediate substrate body made of an insulating material, and having a first face to be mounted with the semiconductor element and a second face to be mounted on the surface of the substrate; and a plurality of first face terminals arranged on the side of the first face; a plurality of second face terminals arranged on the side of the second face; and conductor structures disposed in the intermediate substrate body for conducting the first face terminals and the second face terminals with each other, wherein the semiconductor element and the intermediate substrate body are filled inbetween with a resin filler, wherein the substrate and the intermediate substrate body are filled inbetween with a resin filler, wherein two opposed ones of the sides perpendicular to the thickness direction of the semiconductor element have individual lengths substantially equal to or smaller within a range of 4 mm or less than that of such two ones of the sides perpendicular to the thickness direction of the intermediate substrate body as correspond to the opposed two sides of the semiconductor element, and wherein the remaining two opposed ones of the sides perpendicular to the thickness direction of the semiconductor element have individual lengths smaller by 4 mm or more than that of such two ones of the sides perpendicular to the thickness direction of the intermediate substrate body as correspond to the remaining opposed two sides of the semiconductor element.

In the aforementioned solving means, the two opposed ones of the sides perpendicular to the thickness direction of the semiconductor element have individual lengths substantially equal to or smaller within a range of 4 mm or less than that of such two ones of the sides perpendicular to the thickness direction of the intermediate substrate body as correspond to the opposed two sides of the semiconductor element. It is assumed that the substantial equality permits a difference of about 400 to 500 microns.

According to this solving means, therefore, either the semiconductor element and the intermediate substrate body or the substrate and the intermediate substrate body are filled inbetween with the resin filler. As a result, the thermal stress is relaxed in the mounted portion between the semiconductor element (e.g., the IC chip) and the substrate (e.g., the wiring substrate such as the IC chip mounting substrate or the IC package substrate). In other words, the thermal stress is relaxed either between the semiconductor element and the intermediate substrate body (or the interposer body) or between the substrate (e.g., the wiring substrate such as the IC chip mounting substrate or the IC package substrate) and the intermediate substrate body (or the interposer body). Therefore, it is possible to provide a structure of an excellent connection reliability, which is constructed to include the semiconductor element, the intermediate substrate and the substrate.

In this solving means, moreover, the two opposed ones of the sides perpendicular to the thickness direction of the semiconductor element have individual lengths substantially equal to (with a difference of about 0.4 to 0.5 mm) or smaller (with a difference of 4 mm or less) than that of such two ones of the sides perpendicular to the thickness direction of the intermediate substrate body as correspond to the opposed two sides of the semiconductor element, and the remaining two opposed ones of the sides perpendicular to the thickness direction of the semiconductor element have individual lengths smaller (with a difference of 4 mm or more) than that of such two ones of the sides perpendicular to the thickness direction of the intermediate substrate body as correspond to the remaining opposed two sides of the semiconductor element.

In case the size of the intermediate substrate body in the top plan view is larger than the size of the semiconductor element in the top plan view, the plane (or, the free space) for allowing the resin filler to be applied is retained on the surface (or the first face) of the intermediate substrate body when the semiconductor element and the intermediate substrate body are filled inbetween with the resin filler. Once the resin filler is applied to the free space, therefore, it is possible to fill the semiconductor element and the intermediate substrate body easily inbetween with the resin filler.

However, the following problems arise, in case the two opposed ones of the sides perpendicular to the thickness direction of the semiconductor element have individual lengths substantially smaller by 4 mm or more than that of such two ones of the sides perpendicular to the thickness direction of the intermediate substrate body as correspond to the opposed two sides of the semiconductor element and in case the remaining two opposed ones of the sides perpendicular to the thickness direction of the semiconductor element have individual lengths smaller by 4 mm or more than that of such two ones of the sides perpendicular to the thickness direction of the intermediate substrate body as correspond to the remaining opposed two sides of the semiconductor element. In short, the following problems arise, in case the first face of the intermediate substrate body is exposed partially over a width of 2 mm or more in the top plan view around all of the four sides of the semiconductor element.

Around all the four sides of the semiconductor element, as described above, there are retained the planes (or the free spaces), to which the resin filler can be applied. When the resin filler is applied to the free spaces around the four sides of the semiconductor element thereby to fill the joint portion therewith between the IC chip and the intermediate substrate, the resin filler applied fails to fill between the IC chip and the intermediate substrate completely. Thus, a defect is caused by the cavity, which occurs along any side of the semiconductor element.

This defect is caused by the fact that the applied resin filler flows over the free space around the four sides of the semiconductor element dominantly around the semiconductor element so that the resin filler surrounds the four sides of the semiconductor element. Then, the cavity of the resin filler occurs between the semiconductor element and the intermediate substrate. When the cavity thus occurs in the resin filler, it is impossible to prevent the crack or the like completely from occurring in the joint portion between the IC chip and the intermediate substrate.

In the foregoing solving means, the two opposed ones of the sides perpendicular to the thickness direction of the semiconductor element have individual lengths substantially equal to or smaller within a range (or a difference) of 4 mm or less than that of such two ones of the sides perpendicular to the thickness direction of the intermediate substrate body as correspond to the opposed two sides of the semiconductor element, and the remaining two opposed ones of the sides perpendicular to the thickness direction of the semiconductor element have individual lengths smaller by 4 mm or more than that of such two ones of the sides perpendicular to the thickness direction of the intermediate substrate body as correspond to the remaining opposed two sides of the semiconductor element. In short, the first face of the intermediate substrate body is hardly exposed to its portion in the top plan view wholly around the four sides of the semiconductor element.

Unlike the foregoing description, the plane (or the free space) capable of applying the resin filler is retained not wholly around the four sides of the semiconductor element but only around the sides around a portion of the semiconductor element. Therefore, the resin filler applied does not flow around the semiconductor element.

Therefore, the resin filler does not surround the four sides of the semiconductor element so that the cavity of the resin filler can be reliably prevented from occurring between the semiconductor element and the intermediate substrate. Moreover, it is possible to prevent the crack or the like from occurring in the joint portion between the IC chip and the intermediate substrate.

In the foregoing solving means, it is more preferable that a portion of the first face of the intermediate substrate body in the top plan view is exposed around only one side of the semiconductor element. This is because the four sides of the semiconductor element can be reliably prevented from being surrounded by the resin filler, thereby to prevent the cavity in the resin filler more reliably from occurring between the semiconductor element and the intermediate substrate.

In the aforementioned solving means, it is more preferable that the two opposed ones of the sides perpendicular to the thickness direction of the semiconductor element have individual lengths smaller within a range of 4 mm or more than that of such two ones of the sides perpendicular to the thickness direction of the intermediate substrate body as correspond to the opposed two sides of the semiconductor element. Around only one side of the semiconductor element, it is preferred that a portion of the first plane of the intermediate substrate body in the top plan view is exposed with a width of 2.2 mm or more, for example, along the direction perpendicular to one side of the semiconductor element.

It is more preferable that such one of the sides of the intermediate substrate body as corresponds to one side of the semiconductor element has a length smaller within a range of 4.8 mm or more than that of one side perpendicular to the thickness direction of the semiconductor element. Around only one side of the semiconductor element, it is preferred that a portion of the first plane of the intermediate substrate body in the top plan view is exposed with a width of 2.4 mm or more along the direction perpendicular to one side of the semiconductor element.

According to these constructions, the free space is reliably retained so that it can be more easily filled with the resin filler.

In the foregoing description, moreover, it is preferable that such one of the sides of the intermediate substrate body as corresponds to one side of the semiconductor element has a length smaller within a range of 6.0 mm or less than that of one side perpendicular to the thickness direction of the semiconductor element. Around only one side of the semiconductor element, it is preferred that a portion of the first plane of the intermediate substrate body in the top plan view is exposed with a width of 3.0 mm or less along the direction perpendicular to one side of the semiconductor element.

In case such one of the sides of the intermediate substrate body as corresponds to one side of the semiconductor element has a length larger by 6.0 mm than that of one side perpendicular to the thickness direction of the semiconductor element, the free space becomes larger than necessary. It is, therefore, unpreferable that the intermediate substrate body itself is large-sized, and that a warpage is induced on the side of the free space at the firing time.

In these solving means, moreover, the substantially plate-shaped intermediate substrate body made of an insulating inorganic material is used to reduce the difference of the thermal expansion coefficient from that of the semiconductor element so that any high thermal stress does not act directly on the semiconductor element. Even if the semiconductor element has a large size and a high calorific power, therefore, the crack or the like is hard to occur. Therefore, a high connection reliability can be given between the intermediate substrate and the semiconductor element.

It is suitable for realizing the aforementioned solving means to use the following intermediate substrate in addition to the aforementioned structure. That is: an intermediate substrate comprising: a substantially plate-shaped intermediate substrate body having a first face, on which a semiconductor element having facial connection terminals are mounted, a second face and made of an insulating material; a plurality of first face terminals arranged on the side of the first face; a plurality of second face terminals arranged on the side of the second face; and a conductor structure disposed in the intermediate substrate body for making the first face terminals and the second face terminals conductive with each other, wherein the center distance between the adjacent second face terminals is set larger than that between the adjacent first face terminals.

It is also suitable to use an intermediate substrate having a semiconductor element, comprising: a semiconductor element having facial connection terminals; a substantially plate-shaped intermediate substrate body having a first face, on which a semiconductor element having facial connection terminals are mounted, a second face and made of an insulating material; a plurality of first face terminals arranged on the side of the first face; a plurality of second face terminals arranged on the side of the second face; and a conductor structure disposed in the intermediate substrate body for making the first face terminals and the second face terminals conductive with each other, wherein the center distance between the adjacent second face terminals is set larger than that between the adjacent first face terminals.

It is further suitable to use a substrate having an intermediate substrate, comprising: a substrate having facial connection pads and a thermal expansion coefficient of 5.0 ppm/° C. or higher; a substantially plate-shaped intermediate substrate body having a first face, on which a semiconductor element having facial connection terminals are mounted, a second face and made of an insulating material; a plurality of first face terminals arranged on the side of the first face; a plurality of second face terminals arranged on the side of the second face; and a conductor structure disposed in the intermediate substrate body for making the first face terminals and the second face terminals conductive with each other, wherein the center distance between the adjacent second face terminals is set larger than that between the adjacent first face terminals.

According to these preferable examples, the center distance between the adjacent second face terminals is set larger than that between the adjacent first face terminals so that the bumps, for example, can be easily formed over the second face terminals. This makes it possible to manufacture the intermediate substrate relatively easily. In this case, moreover, the center distance between the facial connection terminals corresponding to the second face terminals can be set rather large to form the bumps easily over the facial connection pads on the side of the substrate (e.g., the IC chip mounting substrate or the IC package substrate). Therefore, the substrate can be manufactured relatively easily. Moreover, the yield of the substrate is improved to reduce the percent defect.

Moreover, bumps of a desired size can be formed over the second face terminals and the facial connection pads so that a high connection reliability can be given between the intermediate substrate and the substrate. Moreover, this substrate uses the substantially plate-shaped intermediate substrate body made of an insulating inorganic material so that the difference in the thermal expansion coefficient from the semiconductor element is reduced to apply no high thermal stress directly to the semiconductor element. Therefore, the crack or the like hardly occurs even if the semiconductor element has a large size and a high calorific power. Therefore, a high connection reliability can be given between the intermediate substrate and the semiconductor element.

The semiconductor element to be used in the aforementioned solving means may preferably have a thermal expansion coefficient of 2.0 ppm/° C. or more and 5.0 ppm/° C. or less and the facial connection terminals. This semiconductor element can be exemplified by a semiconductor integrated circuit chip (or an IC chip) made of silicon and having a thermal expansion coefficient of about 2.6 ppm/° C. The facial connection terminals are terminals for electric connections by the facial connections. Here, the facial connections indicate the case, in which pads or terminals are formed in a linear shape or in a grid shape (including a staggered shape) over the plane of an object and connected with each other. Here, the size and shape of the semiconductor element should not be limited to an especial one but may have at least one side of 10.0 mm or more. When the semiconductor element is thus large-sized, it is liable to increase the calorific power and the influences of the thermal stress gradually so that the problems of the invention easily arise. Moreover, the thickness of the semiconductor element is not especially limited but may be 1.0 mm or less. When the semiconductor element has a thickness of 1.0 mm or less, its strength may be lowered to cause the crack or the like. There easily occur the problems of the invention, in which the high connection reliability cannot be given between the semiconductor element and the intermediate substrate.

The substrate used has a thermal expansion coefficient of 5.0 ppm/° C. or more and has the facial connection pads, for example. The substrate is exemplified by the substrate, on which the semiconductor element or other electronic parts are mounted, or especially by the wiring substrate, on which the semiconductor element or other electronic parts are mounted and which is provided with a conductor circuit for connecting them electrically. The material for forming the substrate is not especially limited, if it satisfies the condition that the thermal expansion coefficient is 5.0 ppm/° C. or more, and can be suitably selected in consideration of the cost performance, the workability, the insulation, the mechanical strength and so on. The substrate can be exemplified by a resin substrate, a ceramic substrate, a metal substrate or the like.

The resin substrate is exemplified by an EP resin (or an epoxy resin) substrate, a PI resin (or a polyimide resin) substrate, a BT resin (or a bismaleimide-triazine resin) substrate, a PPE resin (or a polyphenylene ether resin) substrate or the like, but should not be limited thereto. In addition, the substrate may also be made of a composite material of those resins and organic fibers such as glass fibers (e.g., woven or non-woven fabric) or polyamide fibers. Alternatively, the substrate may also be made of a resin-resin composite material, which is prepared by impregnating a three-dimensional network fluorine containing resin substrate such as continuously porous PTFE with a thermoset resin such as an epoxy resin. The ceramic substrate is specified by a substrate made of a low-temperature fired material such as an alumina substrate, a beryllia substrate, a grass ceramic substrate or a crystal glass, but should not be limited thereto. The metal substrate is specified by a copper substrate, a copper alloy substrate, a substrate made of a simple substrate of a metal other than copper, or a substrate made of an alloy of a metal other than copper, but should not be limited thereto.

On the other hand, the facial connection pads possessed by the substrate are terminal pads for electric connections with the intermediate substrate by the facial connections. These facial connection pads are formed either in a linear shape or in a grid shape (including a staggered shape).

The intermediate substrate has the substantially plate-shaped intermediate substrate body made of the insulating inorganic material. The thermal expansion coefficient of the intermediate substrate body is not especially limited but may preferably have an intermediate value between those of the semiconductor element and the substrate, as specified by 2.0 ppm/° C. or more and 8.0 ppm/° C. or less. This reasoning will be described in the following. If the thermal expansion coefficient of the intermediate substrate body exceeds 8.0 ppm/° C., the difference in the thermal expansion coefficient from that of the semiconductor element is not sufficiently reduced so that the influences of the thermal stress on the semiconductor element cannot be sufficiently lowered. In case an IC chip of silicon having a thermal expansion coefficient of about 2.6 ppm/° C. is selected, for example, it can be said to use an intermediate substrate body having a thermal expansion coefficient of 3.0 ppm/° C. or more and 8.0 ppm/° C. or less. It is more preferable to use the intermediate substrate body having a thermal expansion coefficient of 3.0 ppm/° C. or more and 5.0 ppm/° C. or less.

As the material for making the intermediate substrate body, there is used an inorganic material represented by ceramics. This is because the ceramics generally has a smaller thermal expansion coefficient than those of the resins and is suited for the material for the intermediate substrate body. This is also because the ceramics have preferable characteristics in addition to the low thermal expansion coefficient. These ceramics are preferably exemplified by insulating engineering ceramics (e.g., alumina or beryllia) of oxides, or insulating engineering ceramics of non-oxides (or insulating engineering ceramics of nitrides, as represented by aluminum nitride, silicon nitride or boron nitride). Here, the ceramics used in the intermediate substrate body may be prepared not only as ceramics fired at a high temperature of about 1,000° C. or more but also as ceramics (i.e., the so-called "low-temperature fired ceramics) fired at a relatively low temperature of about 700° C. to about 800° C. Ceramics containing borosilicate glass, alumina or silica are known as the low-temperature fired ceramics, which should not be limited to those.

Here, the "thermal expansion coefficient" means one in the directions (i.e., the X- and Y-directions) perpendicular to the thickness direction (i.e., the Z-direction) and is measured at 0° C. to 100° C. with the TMA (ThermoMechanical Analysis) apparatus. Here, the "TMA" is the thermomechanical analysis, which is regulated under JPCA-BU01, for example. For example: the alumina has a thermal expansion coefficient of 7.6 ppm/° C.; the aluminum nitride has a thermal expansion coefficient of 4.4 ppm/° C.; the silicon nitride has a thermal expansion coefficient of 3.0 ppm/° C.; and the low-temperature fired ceramics have a thermal expansion coefficient of 5.5 ppm/° C.

The ceramics to be selected as the material to make the intermediate substrate body may have the insulating properties, as described above. This is because the intermediate substrate body having no insulating properties has to be provided beforehand with the insulating layer when the conductor structure such as the conductor columns is to be formed, but the intermediate substrate body having the insulating properties does not require that insulating layer. As a result, it is possible to avoid the complexity of the structure and the increase in the step number of the intermediate substrate and accordingly to contribute to the lower cost for the entire structure.

The thickness of the intermediate substrate body is not especially limited, but is daringly preferable to be 0.1 mm and more and 0.7 mm or less and more preferable to be 0.1 mm or more and 0.3 mm or less. Within such ranges, the thermal stress to be applied to the semiconductor element joint portion when the structure is made becomes so relatively low as to be advantageous for preventing the warpage of the intermediate substrate body itself and the crack or the like at the portion jointed to the semiconductor element.

It is also preferred that the intermediate substrate body has not only a low thermal expansibility, as described above, but also a high rigidity (i.e., a high Young's modulus and a high bending elastic modulus). Specifically, the rigidity of the intermediate substrate body, that is, the Young's modulus is preferable to be higher than at least that of the semiconductor element, such as 200 GPa or especially 300 GPa. This reasoning will be described in the following. If the intermediate substrate body is given a high rigidity, it can endure a high thermal stress, if applied. Therefore, the warpage of the intermediate substrate body itself and the crack or the like of the joint portion of the semiconductor element can be prevented in advance. Here, the ceramic material satisfying those conditions is exemplified by alumina (having a Young's modulus=280 GPa), aluminum nitride (having a Young's modulus=350 GPa), silicon nitride (having a Young's modulus=300 GPa) or the like, but it should not be limited thereto.

On the other hand, another index or a bending elastic modulus indicating the rigidity of the intermediate substrate body is preferable to be 200 MPa or more, especially 300 MPa or more. This reasoning will be described in the following. If the intermediate substrate body is given a high rigidity, it can endure a high thermal stress, if applied. Therefore, the warpage of the intermediate substrate body itself and the crack or the like of the joint portion of the semiconductor element can be prevented in advance. Here, the ceramic material satisfying those conditions is exemplified by alumina (having a bending elastic modulus=350 MPa), aluminum nitride (having a bending elastic modulus=350 MPa), silicon nitride (having a bending elastic modulus=690 MPa), low-temperature fired ceramics (having a bending elastic modulus=200 MPa) or the like, but it should not be limited thereto.

It is more preferable that the intermediate substrate body has not only the low thermal expansibility and the high rigidity, as described before, but a high heat radiation. Here, the "high heat radiation" means that the intermediate substrate body has at least a higher heat radiation (e.g., a higher heat conductivity) than that of the substrate. This reasoning will be described in the following. If an intermediate substrate body used has a high heat radiation, it can transfer and dissipate the heat generated by the semiconductor element so that the thermal stress can relaxed. Therefore, any high thermal stress does not act to prevent the warpage of the intermediate substrate body itself and the crack and so on of the joint portion of the semiconductor element in advance. Here, the ceramic material satisfying these conditions is exemplified by aluminum nitride, but it should not be limited thereto.

The plural first face terminals are arranged on the first face side of the intermediate substrate body, and the plural second face terminals are arranged on the second face side.

The number of the first face terminals should not be limited to a specific value but is set according to the number of the facial connection terminals which are usually possessed by the semiconductor element. The size of the first face terminals should not be especially limited but may be specified by a diameter of 125 microns or less, especially by a diameter of 100 microns or less (although excepting 0 microns). This is because an excessively long center distance could not sufficiently match the fineness of the semiconductor element anticipated in the future. Moreover, it is preferred that the center distance between the adjacent first face terminals is 250 microns or less, preferably 200 microns or less, especially 150 microns or less (although excepting 0 microns). This is because the reduction of the center distance to such values will easily cause such a problem of the invention that it is difficult to form the second face terminals.

Moreover, the number, size and so on of the plural second face terminals should not be especially limited, but the number of the second face terminals is substantially equal to that of the first face terminals.

The intermediate substrate body is provided with the conductor structure for making the first face terminals and the second face terminals conductive with each other. This conductor structure is constructed to include a plurality of conductor columns extending in the thickness direction of the intermediate substrate, and a wiring line group composed of a plurality of wiring lines extending in the facial direction of the intermediate substrate and connected with the conductor columns. It is preferable that the wiring line group has fan-out portions, in which the spacing between the adjacent wiring lines is wider. Here, the sentence "the spacing between the adjacent wiring lines is wider" means that, in case a plurality of wiring lines are directed mainly from the central portion of the intermediate substrate body to the outer periphery of the intermediate substrate body, the adjacent wiring lines leave each other in the facial direction of the intermediate substrate so that their spacing becomes wider. Here, the structure, in which the center distance between the adjacent second face terminals is longer than the center distance between the adjacent first face terminals, can be realized relatively easily by providing the wiling line group having the fan-out portions.

The conductor columns can be formed by filling the holes formed in the intermediate substrate body, for example, with a conductive metal. The first face terminals may be arranged on the one-side end faces of the conductor columns, and the second face terminals may be arranged on the other-side end faces. The conductive metal can be exemplified by one or two kinds of metals selected from the group consisting of copper, gold, silver, platinum, palladium, nickel, tin, lead, titanium, tungsten, molybdenum, tantalum and niobium, but it should not be limited thereto. The conductive metal composed of two or more kinds of metals can be exemplified by solder or an alloy of tin and lead. A specific method for filling the holes with the conductive metal is exemplified not only by a method for printing and filling the fluid material (e.g., a conductive metal paste) prepared to contain the conductive metal but also by a method for plating the conductive metal. The diameter of the conductor columns should not be especially limited but may be smaller than the diameters of the first face terminals or the second face terminals. This diameter is specifically preferred to be 100 microns or less, more preferably 80 microns or less (although excepting 0 microns). This is because, if the conductor columns have excessively small diameters, their percent occupation in the intermediate substrate body is so small as to increase the space accordingly for forming the wiring lines in the intermediate substrate body.

The wiring lines are made suitable by forming a layer of a conductive metal into a predetermined pattern in the intermediate substrate body, for example. The conductive metal can be exemplified by one or two kinds of metals selected from the group consisting of copper, gold, silver, platinum, palladium, nickel, tin, lead, titanium, tungsten, molybdenum, tantalum and niobium, but it should not be limited thereto. The conductive metal composed of two or more kinds of metals can be exemplified by solder or an alloy of tin and lead. A specific method for forming the wiring lines is exemplified not only by preparing and printing a fluid material (e.g., a conductive metal paste) containing a conductive metal but also by plating the conductive metal, by sputtering the conductive metal and so on. Here, the wiring line forming conductive metal may be of the same kind as the conductive metal for forming the conductor columns or another.

Here, the wiring line group having the fan-out portions, in which the spacing between the adjacent wiring lines is wider, may be arranged either in the surface layer or the inner layer of the intermediate substrate body, of which the inner layer is especially desirable. In case the wiring line group is arranged in the surface layer of the intermediate substrate body, it is necessary to form a protective structure (e.g., a solder resist) for avoiding adhesion or the like of the solder. However, this necessity may lead to the complexity of or the high cost for the structure. If the wiring line group is arranged in the inner layer of the intermediate substrate body, on the contrary, the structure for avoiding the adhesion or the like of the solder can be dispensed with to prevent the complexity of and the high cost for the structure. In case the wiring line layer is arranged in the surface layer (i.e., the surface layer on the first face side) of the intermediate substrate body, moreover, the handling of the wiring lines becomes difficult to make the manufacture of the intermediate substrate difficult when the first face terminals are increased or have a reduced center distance. If the wiring line group is arranged in the inner layer of the intermediate substrate body, on the contrary, the wiring lines can be handled relatively freely without being influenced by the state of the first face terminals. Therefore, the manufacture of the intermediate substrate hardly becomes difficult. Here, the aforementioned structure can be exemplified by the laminated sintered ceramic member having a structure, in which a plurality of sheets of insulating ceramic material are laminated, as the intermediate substrate body. This is because the structure having the wiring line group sandwiched between the insulating ceramic materials would function as the protective structure, in which the insulating ceramic material itself protects the wiring line group.

In case the conductor columns and the wiring line group are formed of a material containing the conductive metal such as the conductive metal paste for the intermediate substrate body of ceramics, it is arbitrary to use the simultaneous firing method or the after firing method. The simultaneous firing method is a method for sintering the ceramics and the conductive metal simultaneously. The after firing method is a method for filling and sintering the conductive metal after the ceramics was sintered beforehand.

The method for manufacturing the intermediate substrate using the simultaneous firing method is suitably exemplified by a method for manufacturing the intermediate substrate, comprising: the non-sintered ceramic member preparing step of preparing a non-sintered ceramic member having a plurality of through holes; the metal filling step of filling the plural through holes with a conductive metal; the metal layer forming step of forming a layer of a conductive metal into a predetermined pattern over the surface of the non-sintered ceramic member; and the simultaneous firing step of heating and sintering the non-sintered ceramic member and the conductive metal. A more suitable method for manufacturing the intermediate substrate is a method for manufacturing the intermediate substrate, comprising: the non-sintered ceramic member preparing step of preparing a non-sintered ceramic member having a plurality of through holes; the metal filling step of filling the plural through holes with a conductive metal; the metal layer forming step of forming a layer of a conductive metal into a predetermined pattern over the surface of the non-sintered ceramic member; the laminating step of laminating and integrating the non-sintered ceramic member having passed through the metal filling step and the metal layer forming step, into a plurality of sheets with the layer of the conductive metal being arranged in the inner layer, thereby to form a non-sintered laminated member; and the simultaneous firing step of heating and sintering the non-sintered ceramic member and the conductive metal.

On the other hand, the method for manufacturing the intermediate substrate adopting the after firing method is suitably exemplified by a method for manufacturing the intermediate substrate, comprising: the first firing step of firing a non-sintered ceramic member having a plurality of through holes thereby to prepare a sintered member; the metal filling step of filling the plural through holes in the sintered member with a conductive metal; the metal layer forming step of forming a layer of the conductive metal into a predetermined pattern over the surface of the sintered member; the second firing step of firing the conductive metal; and the laminating step of laminating and integrating a plurality of the sintered member having passed through the metal filling step, the metal layer forming step and the second firing step, with the layer of the conductive metal being arranged in the inner layer, thereby to form a laminated sintered member.

It depends on the kind or the like of the ceramics making the intermediate substrate which of the simultaneous firing method or the after firing method is to be adopted, but either firing method can be adopted. It is advantageous to adopt the simultaneous firing method, in case preference is taken to the lower cost. As compared with the after firing method, the simultaneous firing method generally has a smaller step number to make the production accordingly efficient and can make reliable contribution to the lower cost. In case the ceramics is the high-temperature fired one and in case the simultaneous firing method is adopted, the conductive metal making the conductor columns is properly selected from at least one of the refractory metal group consisting of tungsten, molybdenum, tantalum and niobium. Even if the refractory metal meets a high temperature exceeding 1,000° C. at the firing time, it is neither oxidized nor evaporated and can reside as the proper sintered member in the through holes. In case the ceramics is the low-temperature fired one and in case the simultaneously firing method is adopted, the conductive metal making the conductor columns need be a refractory one least of all. In this case, therefore, it is possible to select a metal (e.g., copper, silver or gold) having a lower melting point than that of tungsten or the like but an excellent conductivity.

If the ceramics making the intermediate substrate such one (e.g., silicon nitride) as cannot be fired simultaneously with the metallic material, the after firing method is necessarily adopted. In this case, however, any metallized layer may be formed on the inner wall faces of the through holes. If the metallized layers are not interposed between the inner wall faces (i.e., the faces made of the sintered ceramic member) in the through holes and the conductive metal thereby to make their direct contact, it may become difficult to give a high contact strength between the inner wall faces and the conductive metal. If the metallized layer exists between the inner wall faces of the through holes and the conductive metal, on the contrary, a high contact strength can be given inbetween. Therefore, the crack or the like hardly occurs in the interfaces between the inner wall faces of the through holes and the conductive metal so that the reliability can be improved in the interface between the ceramics and the metal. In case the ceramics to be fired simultaneously with the metallic material is adopted, on the other hand, the metallized layer is not always necessary so that it can be dispensed with.

It is preferred that the protruding electrodes such as the solder bumps are formed over the surface of at least one of the first face terminals and the second face terminals, and it is more preferred that the solder bumps are formed at both the first face terminals and the second face terminals. This reasoning will be described in the following. If the solder bumps are protruded from the intermediate substrate side, the connections with the facial connection terminals or the facial connection pads can be made easily and reliably. The solder bumps can be formed by printing the well-known solder material and by causing it to reflow.

DETAILED DESCRIPTION OF THE INVENTION

Figure 1:
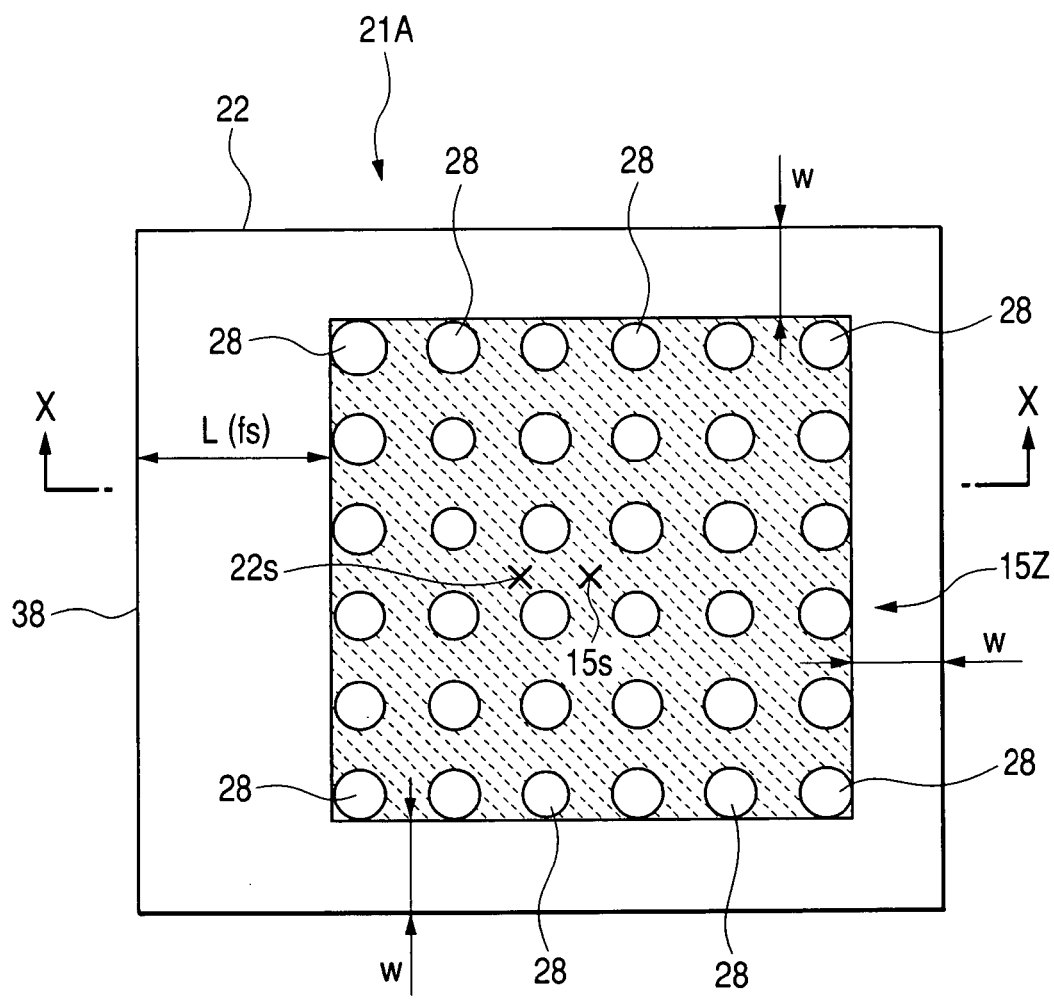
FIG. 1 is a top plan view showing an interposer (or an intermediate substrate) of the invention.
Figure 2:
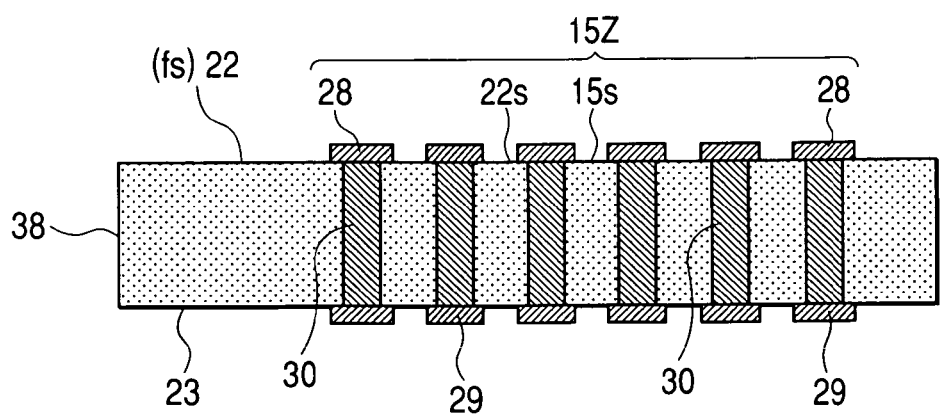
FIG. 2 is a sectional view taken along line X-X of FIG. 1.
Figure 3:
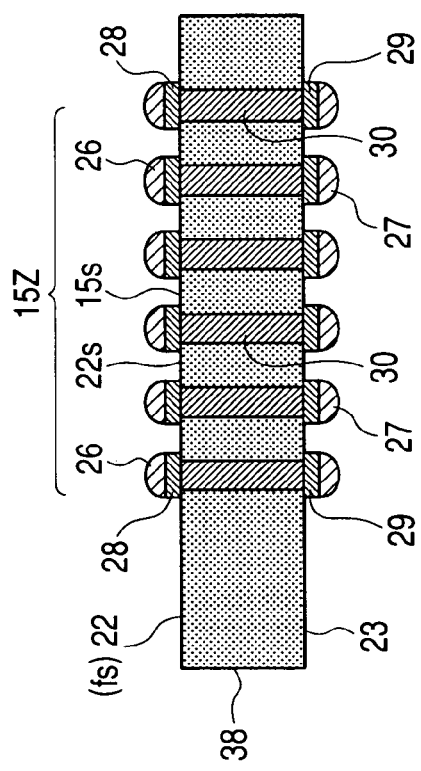
FIG. 3 is a schematic section showing the state, in which solder bumps are formed on the intermediate substrate.
Figure 4:
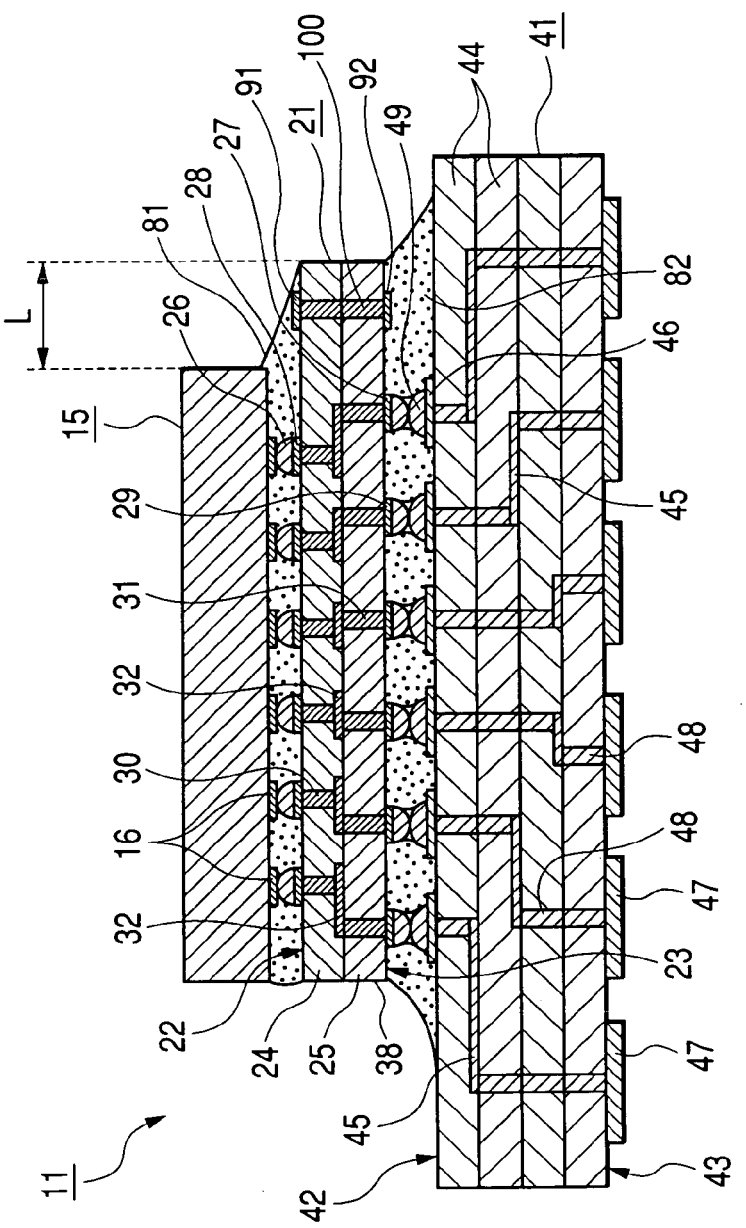
FIG. 4 is a schematic section showing a semiconductor package structure (or a structure) including an IC chip (or a semiconductor element), an interposer (or an intermediate substrate) and a wiring lines substrate (or a substrate)
Figure 5:
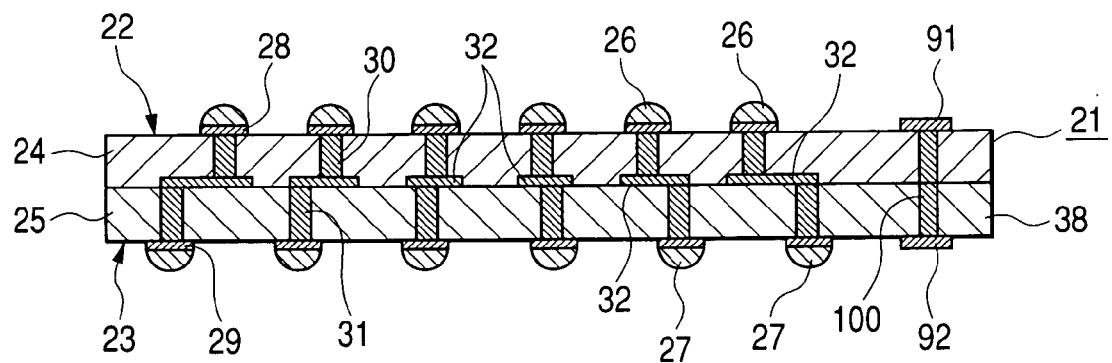
FIG. 5 is a schematic section showing the interposer (or the intermediate substrate) for constructing the semiconductor package structure of the embodiment.
Figure 6:
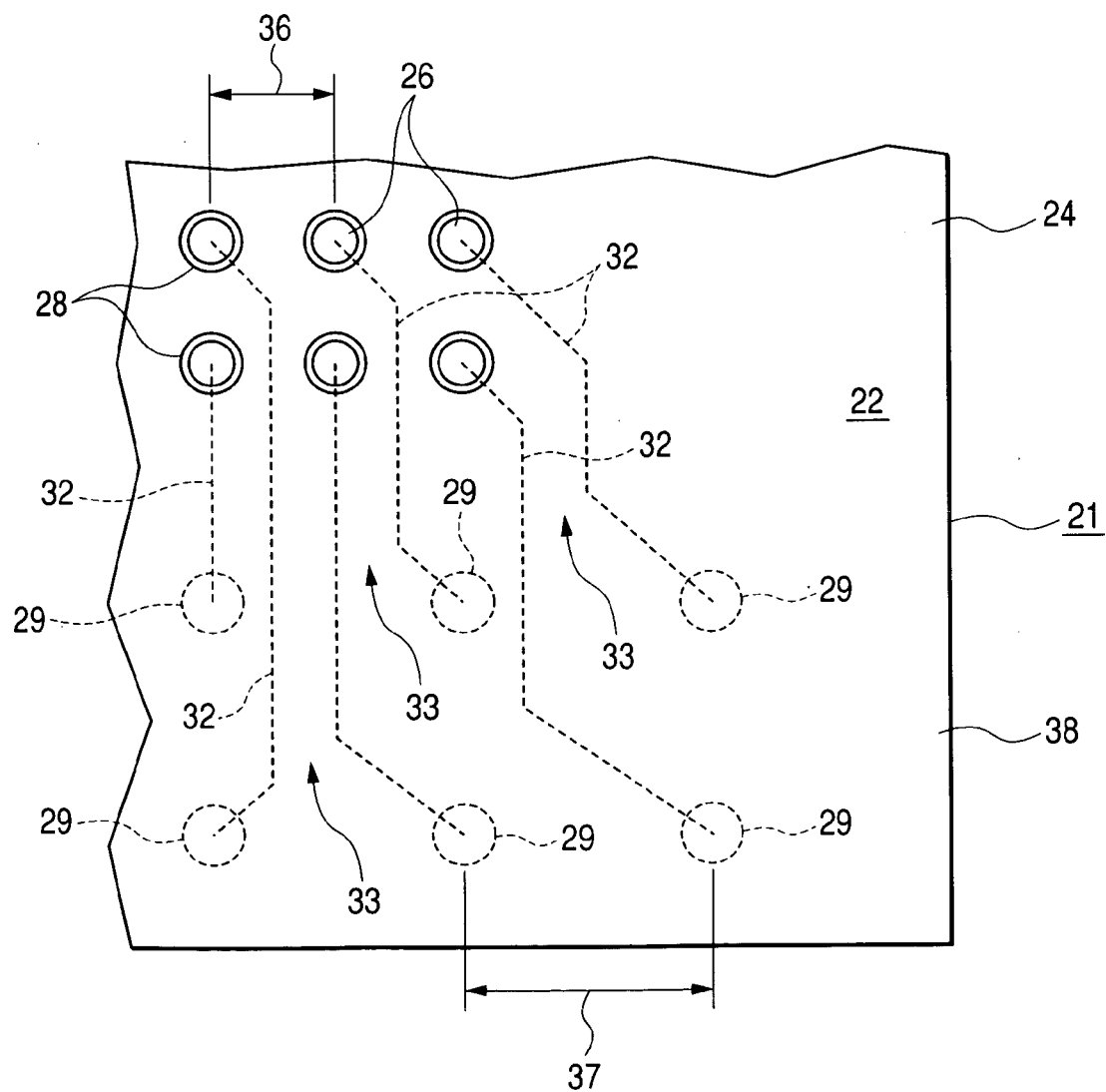
FIG. 6 is a top plan view showing a portion of the interposer (or the intermediate substrate) of the embodiment in an enlarged scale.
Figure 7:
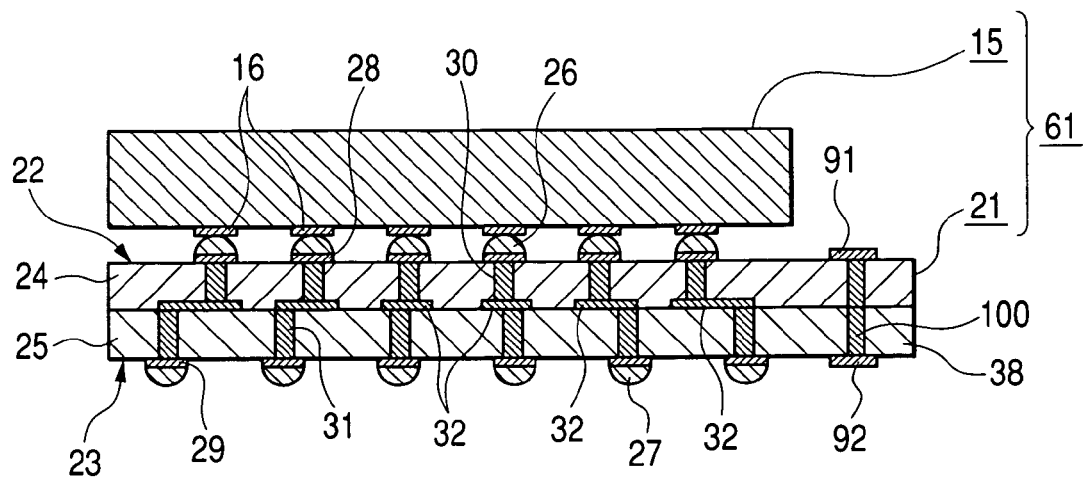
FIG. 7 is a schematic section showing an interposer with an IC chip (or an intermediate substrate with a semiconductor element) constructing the semiconductor package structure of the embodiment.
Figure 8:
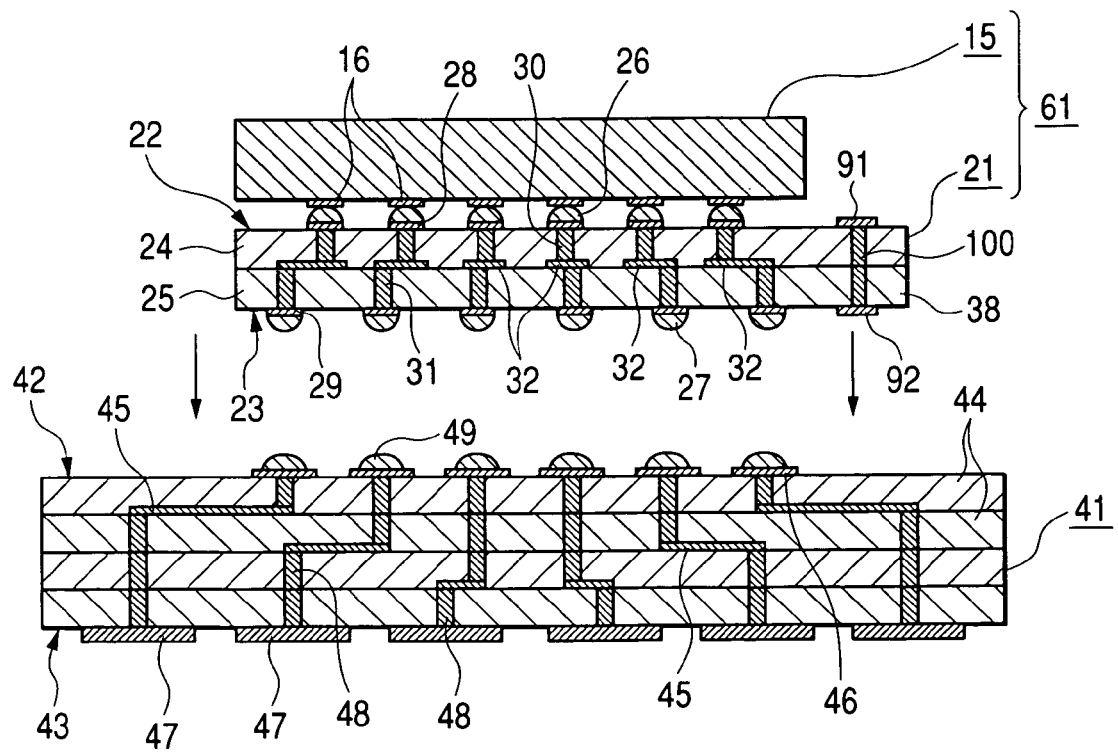
FIG. 8 is a schematic section showing the state, in which the interposer with the interposer of the embodiment is mounted on a wiring substrate.
Figure 9:
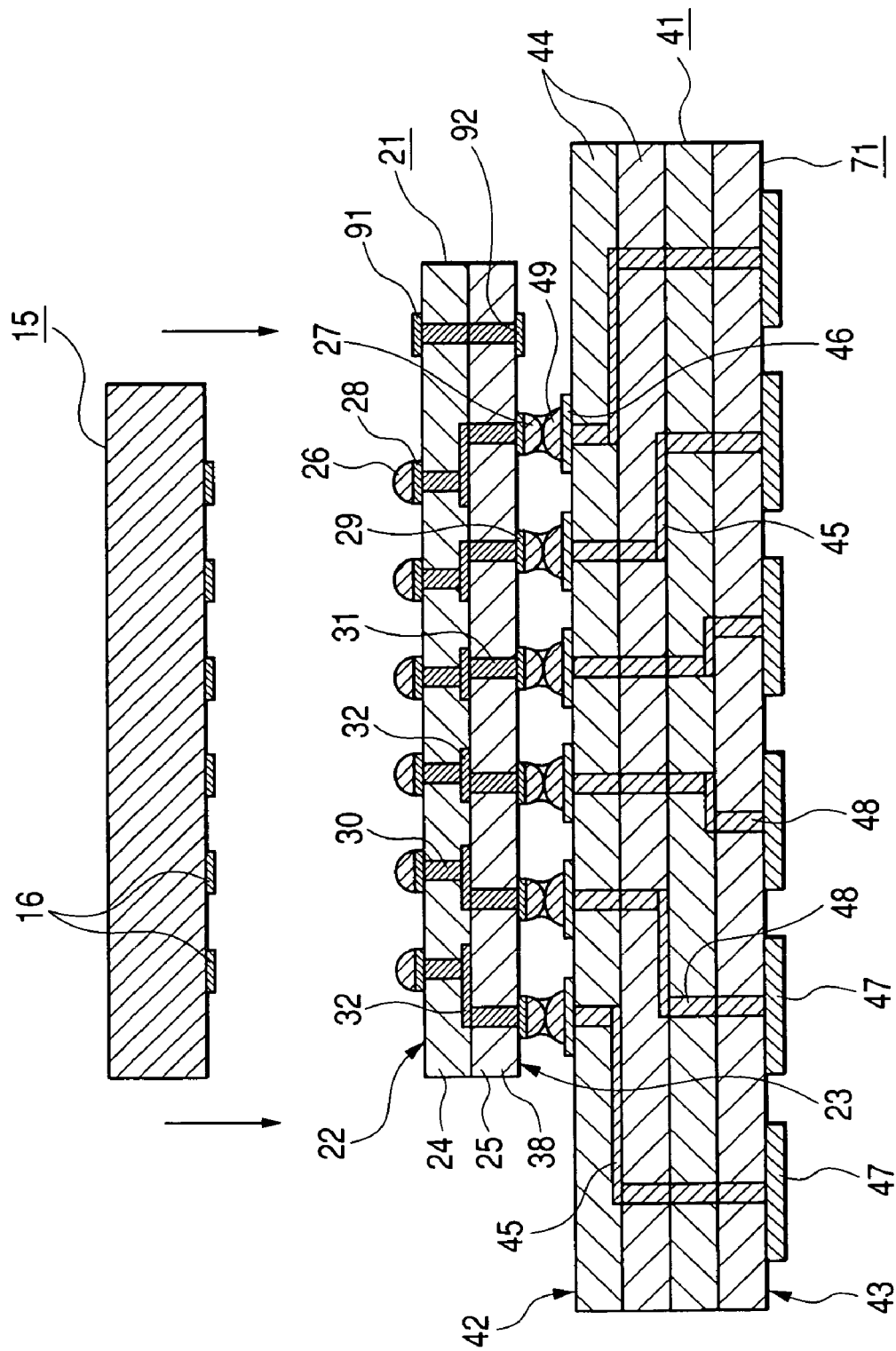
FIG. 9 is a schematic section showing the state of the embodiment, in which an IC chip is mounted on a wiring lines substrate with an interposer (or a substrate with an intermediate substrate)
Figure 10:
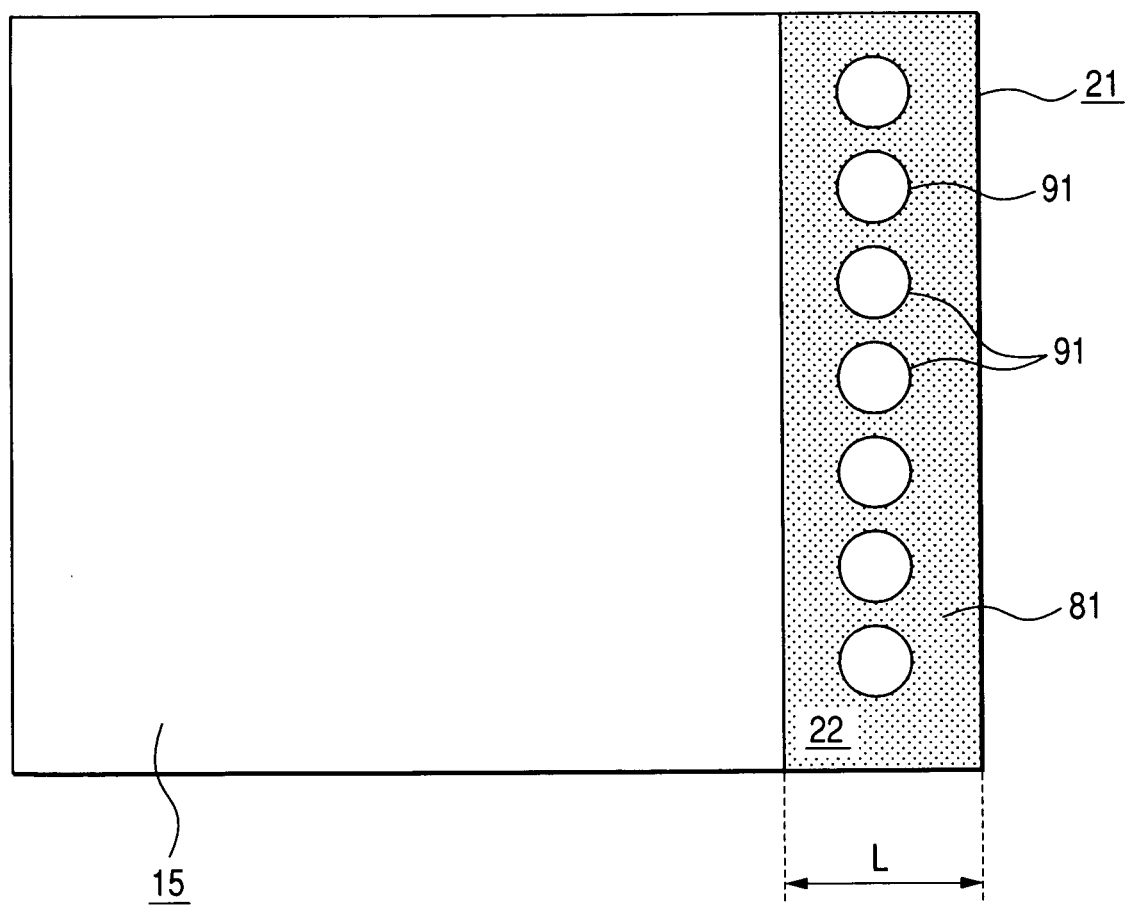
FIG. 10 is a top plan view of a portion showing the IC chip and the interposer of the embodiment shown in FIG. 1.
Figure 11:
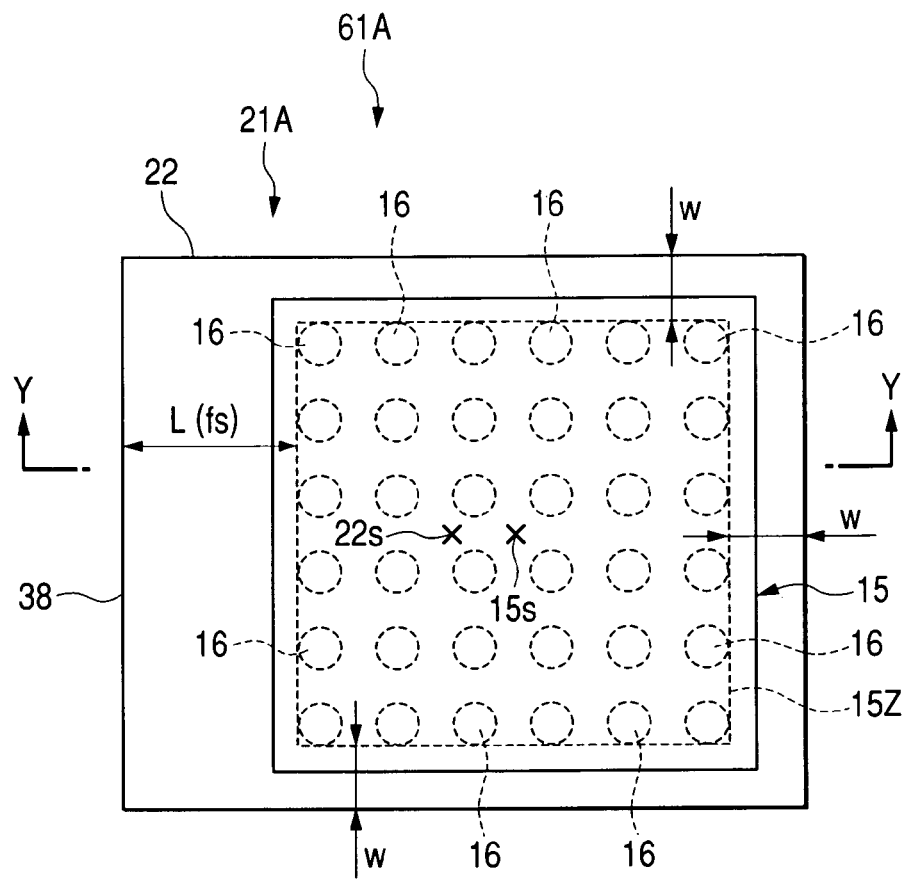
FIG. 11 is a top plan view showing an intermediate substrate with a semiconductor element of another embodiment.

One embodiment of the invention will be described in detail with reference to FIG. 1 and so on. FIG. 1 is a top plan view of an interposer (or an intermediate substrate) 21A; FIG. 2 is a sectional view taken along line X-X of FIG. 1; and FIG. 3 is a schematic view showing the state, in which solder bumps 26 and 27 are formed over first and second face terminals 28 and 29. FIG. 4 is a schematic section showing a semiconductor package structure (as will also be called the "structure") of this embodiment, which is composed of an IC chip (or a semiconductor element) 15, an interposer 21 (or an intermediate substrate) 21, and a wiring substrate (as will also be called the "substrate") 41 as an IC package substrate. FIG. 5 is a schematic section showing the interposer 21, and FIG. 6 is an enlarged top plan view showing a portion of the interposer 21. FIG. 7 is a schematic section showing an interposer 61 with the IC chip (or the intermediate substrate with the semiconductor element) 61. FIG. 8 is a schematic section showing the state, in which the interposer 61 with the IC chip (or the intermediate substrate with the semiconductor element) 61 is mounted over the wiring substrate 41. FIG. 9 is a top plan view showing a portion of the IC chip (or the semiconductor element) 15 and the interposer (or the intermediate substrate) 21. FIG. 10 is a top plan view showing the interposer with the IC chip of another embodiment, and FIG. 11 is a sectional view taken along line Y-Y of FIG. 10.

As shown in FIG. 1, the intermediate substrate 21A is provided with an intermediate substrate body 38 made mainly of alumina and having a rectangular top plan shape, and a semiconductor element mounting area 15Z presenting a square top plan shape having a side of about 10 mm and including a plurality of first face terminals 28 arranged in a grid shape over the first face (or the upper face) of the intermediate substrate body 38. The first face terminals 28 are made of tungsten (W), for example.

As shown, the semiconductor element mounting area 15Z has a center 15s offset slightly rightward from the center 22s of the first face 22. As a result, narrow planes having a width (or a length) w of 2 mm or less are located between the upper and lower sides and the right side of the first face 22 and the semiconductor element mounting area 15Z. A relatively wider plane (or a free space fs) having such a width (or a length) L as allows the later-described resin filler to be easily applied is formed between the left side of the first face 22 and the aforementioned area 15Z.

Of the four slender planes formed around the mounting area 15Z, as shown in FIG. 1, the width (or the length) L of the plane located between the left side of the first face 22 and the mounting area 15Z is larger than the width w of the three planes, which are located between such upper, lower and right sides of the first face 22 as are adjacent and opposed to that plane, and the mounting area 15Z. In other words, the width (or the length) L of the wider plane (or the free space fs), which is so formed between the left side of the first plane 22 and the mounting area 15Z as to apply the resin filler, is larger than the width w of the three planes adjacent and opposed to that wider plane.

As shown in FIG. 2, the second face terminals 29 of the same number are likewise arranged on the second face (or the lower face) 23 of the intermediate substrate body 38. Via holes (or through holes) extend between the first face terminals 28 and the second face terminals 29, and conductor columns 30 made of tungsten (W) or the like extend through the via holes. Here, the first and second face terminals 28 and 29 and the conductor columns 30 have a diameter of about 80 microns, and the distances between the individual centers of the first and second face terminals 28 and 29 are about 300 microns.

As shown in FIG. 3, the substantially semispherical solder bumps 26 and 27 are individually formed to protrude from the first and second face terminals 28 and 29. The solder bumps 26 and 27 are made of an alloy of a low melting point such as an Sn—Cu containing Sn and Cu in equal quantities. Facial connection terminals 16 of the semiconductor element 15 are connected with the solder bumps 26 over the first face terminals 28, as will be described hereinafter. Facial connection terminals 46 of the wiring substrate 41 are connected with the solder bumps 27 over the second face terminals 29 (as located on the lower side of FIG. 3), as will also be described. These connected portions are filled there around with resin fillers 81 and 82 without any cavity, as will be described hereinafter, so that they are sealed up.

Here, the quantity of the solder bumps 27 may be more than that of the solder bumps 26 in accordance with the size and pitch of the facial connection terminals 46 of the wiring substrate 41.

Here will be described the structure 11 of the invention using the intermediate substrate 21 of a mode of embodiment different from the aforementioned one.

As shown in FIG. 4, the semiconductor package structure 11 of this embodiment is the LGA (Land Grid Array) structure composed of the IC chip 15, the interposer 21 and the wiring substrate 41. Here, the mode of the semiconductor package structure 11 should not be limited only to the LGA but may be a BGA (Ball Grid Array) or PGA (Pin Grid Array) structure. The IC chip 15 having a function as the MPU is made of silicon having a thermal expansion coefficient of about 1.6 ppm/° C. into a rectangular sheet of 10 mm×10 mm. The not-shown circuit elements are formed in the lower surface layer of the IC chip 15. The plural facial connection terminals 16 are formed in a grid shape on the lower face side of the IC chip 15. The center distance of the adjacent facial connection terminals 16 and 16 is set to 120 microns in this embodiment. As shown on the left side of FIG. 4, moreover, the left side of the IC chip 15 and the left side of the interposer 21 are located at substantially the same position in the top plan view. However, it is desired that the left side of the interposer 21 protrudes by 0.2 to 2.0 mm.

The IC chip 15 (or the semiconductor element) and the interposer 21 (or the intermediate substrate) are filled inbetween with the resin filler 81. Moreover, the wiring substrate 41 (or the substrate) and the interposer 21 are also filled inbetween with the resin filler 82.

The resin fillers 81 and 82 are individually made of a composite resin material, which is prepared by dispersing a silica filler into a main component of epoxy resin. This material is exemplified by SEMICOAT (Product Number: 5114) of Shinetsu Kagaku Kabushiki Gaisha. Moreover, the resin fillers 81 and 82 may use the same material or different materials. Here, it is preferred for relaxing the stress the resin fillers 81 and 82 to be used individually have a thermal expansion coefficient of 25.0 ppm/° C. or less. This material is exemplified by XS8437-23 of Namics Kabushiki Gaisha.

In case different materials are used for the resin fillers 81 and 82, it is preferred for the stress relaxation in the entire structure that the thermal expansion coefficient of the resin filler 81 between the IC chip 15 (or the semiconductor element) and the interposer 21 (or the intermediate substrate) is made smaller than that of the resin filler 82 between the wiring substrate 41 (or the substrate) and the interposer 21.

The top plan size (of 10 mm×10 mm) of the IC chip 15 is set larger than that of the interposer body 38 (or the intermediate substrate body). Specifically, the lengths (10 mm) of the sides normal to the thickness direction of the IC chip 15 are set larger than those (i.e., the length of one side of the interposer body 38 corresponding to one side of the IC chip) of the sides normal to the thickness direction of the interposer body 38 (or the intermediate substrate body). In this embodiment, the difference (L of FIG. 4 and FIG. 10) of the length (10 mm) of the sides normal to the thickness direction of the IC chip 15 from the length (15 mm) of the sides normal to the thickness direction of the interposer body 38 is set is set to 5 mm. In other words, the center of the mounting area of the IC chip 15 is located at the position which is offset from the center of the upper face 22 of the interposer body 38, as shown in FIG. 4 and FIG. 10.

The size of the interposer body 38 (or the intermediate substrate body) in the top plan view is larger than the size of the IC chip 15 in the top plan view. When the IC chip 15 and the interposer 21 are filled inbetween with the resin filler 81, therefore, the plane (or the free space having the length L) having the width (or the length L) of 5 mm allowing the application of the resin filler 81 is retained at the position close to the right side of the surface (or the first face) 22 of the interposer 21, so that the resin filler 81 can be easily applied.

Moreover, the free space is retained only around the side (i.e., the right side in FIG. 4 and FIG. 10) of a portion of the IC chip 15. Therefore, the resin filler 81 applied does not flow around (i.e., to the three sides excepting that right side) of the IC chip 15.

Therefore, the resin filler 81 does not surround the four sides of the IC chip 15 so that any cavity can be reliably prevented from being formed in the resin filler 81 between the IC chip 15 and the interposer body 38. It is also possible to prevent any crack or the like from being formed in the joint portion between the IC chip 15 and the interposer 21.

The wiring substrate 41 is the so-called "multi-layered wiring substrate (or the IC package substrate made of the resin)" which is made of a rectangular flat member having an upper face 42 and a lower face 43 and which includes a plurality of insulating resin layers 44 and a plurality of conductor circuits 45. In the case of this embodiment, the insulating resin layer 44 is formed of an insulating base prepared by impregnating glass cloth with an epoxy resin, and the conductor circuits 45 are formed of copper foil or a copper-plated layer. This wiring substrate 41 has a thermal expansion coefficient of 13.0 ppm/° C. or more and less than 16.0 ppm/° C., On the upper face 42 of the wiring substrate 41, there are formed in the grid shape the facial connection pads 46 for electric connections with the side of the interposer 21. The center distances of the adjacent facial connection pads 46 and 46 is set to 20 microns in this embodiment. Substrate side solder bumps 49 or protruding electrodes are formed on the surfaces of the individual facial connection pads 46. On the lower face 43 of the wiring substrate 41, there are formed in a grid shape a plurality of facial connection pads 47 for electric connections with the side of the not-shown mother board. Here, the facial connection pads 47 for the mother board connection have a larger area and a wider pitch than those of the facial connection pads 46 for the interposer connection. The insulating resin layer 44 is provided with via hole conductors 48, through which the conductor circuits 45, the facial connection pads 46 and the facial connection pads 47 of different layers are electrically connected with each other. On the upper face 42 of the wiring substrate 41, on the other hand, there are mounted chip capacitors, semiconductor elements and other electronic parts (all of which are not shown) in addition to the interposer 21 with the IC chip shown in FIG. 5.

As shown in FIG. 4, FIG. 5 and so on, the interposer 21 includes the interposer body 38 (or the intermediate substrate body) of a rectangular flat shape having the upper face 22 (or the first face) and the lower face 23 (or the second face). This interposer body 38 is made of an alumina substrate having a multi-layered structure. More specifically, the interposer body 38 of this embodiment is made of an alumina substrate having a thickness of 0.3 mm and and formed of a two-layered structure having a first insulating alumina layer 24 and a second insulating alumina layer 25 laminated one on the other. This alumina substrate has a thermal expansion coefficient of about 7.6 ppm/° C., a Young's modulus of about 280 GPa and a bending elastic modulus of about 350 MPa. Therefore, the interposer body 38 has a thermal expansion coefficient smaller than that of the wiring substrate 41 and larger than that of the IC chip 15. In short, it can be said that the interposer 21 of this embodiment has a thermal expansibility lower than that of the wiring substrate 41. On the other hand, the Young's modulus of the alumina substrate is higher than that of the IC chip 15 (that is, higher than 190 GPa) so that the interposer 21 of this embodiment has a high rigidity. Here, the interposer body 38 may be made of a low-temperature fired ceramic substrate.

In the first insulating alumina layer 24 forming the interposer body 38, there are formed in the grid the plural via holes (or the through holes) which are extended in the thickness direction of the interposer 21 thereby to fit the conductor columns 30 of tungsten (W) therein. In the second insulating alumina layer 25 forming the interposer body 38, too, there are also formed the plural via holes (or the through holes) which are extended in the thickness direction of the interposer 21 thereby to fit conductor columns 31 of tungsten therein. In the case of this embodiment, both the conductor columns 30 and 31 are set to have a diameter of about 80 microns.

On the upper face 22 at the positions of the upper end faces of the individual conductor columns 30, there are arranged the upper face pads 28 or the first face terminals. These upper face pads are formed in a circular shape of a diameter of 120 microns, and the center distance 36 (as shown in FIG. 6) between the adjacent upper face pads 28 and 28 is set to about 200 microns. On the lower face 23 at the positions of the lower end faces of the individual conductor columns 31, on the other hand, there are arranged the lower face pads 29 or the second face terminals. These lower face pads 29 are formed in a circular shape of a diameter of 120 microns, and the center distance 37 (as shown in FIG. 6) between the adjacent lower face pads 29 and 29 is set to about 300 microns. In this embodiment, more specifically, the center distance 37 between the adjacent lower face pads 29 and 29 is set larger by about 100 microns than that 36 between the adjacent upper face pads 28 and 28.

On the surfaces of the individual upper face pads 28, there are mounted the upper face solder bumps 26 which have the substantially semispherical shape. These upper face solder bumps 26 protrude from the upper faces 22 and are connected with the facial connection terminals 16 on the side of the IC chip 15. On the surfaces of the individual lower face pads 29, there are mounted the lower face solder bumps 27, which have the substantially semispherical shape. These lower face solder bumps 27 protrude from the lower faces 23 and are connected through the substrate side solder bumps 49 with the facial connection pads 46 on the side of the wiring substrate 41.

In the inner layer of the interposer body 38 or in the interface between the first insulating alumina layer 24 and the second insulating alumina layer 25, as shown in FIG. 4, FIG. 5 and FIG. 6, there is arranged a wiring line group of a plurality of wiring lines 32, which are formed in a predetermined pattern. These wiring lines 32 are made of tungsten (W) and extended in the facial direction of the interposer 21. This wiring line group is provided at its plural portions with fan-out portions 33, in which the spacing between the adjacent wiring lines 32 is enlarged (as referred to FIG. 6).

As shown in FIG. 4, FIG. 5 and FIG. 7, the wiring line group is composed of the plural wiring lines which are directed from the central portion to the outer peripheral portion of the interposer body 38. The wiring lines 32 are connected, at their one-end terminals, with the inner ends of the conductor columns 30 belonging to the first insulating alumina layer 24 and, at their other-end terminals, with the inner ends of the conductor columns 31 belonging to the second insulating alumina layer 25. As a result, the electric current flows through the route (or through the reverse route) of the upper face pads 28—the conductor columns 30—the wiring lines —the conductor columns 31—the lower face pads 29. In the semiconductor package structure 11 having this structure, therefore, the side of the wiring substrate 41 and the side of the IC chip 15 are electrically connected through the conductor columns 30 and 31 and the wiring lines 32 of the interposer 21. Through the interposer 21, therefore, the signals are inputted/outputted between the wiring substrate 41 and the IC chip 15, and the electric power is fed to activate the IC chip 15 as an MPU. In case the interposer body 38 is made of the low-temperature fired ceramic substrate, the conductor columns 30 and 31 and the wiring lines 32 may formed of a highly conductive metal such as silver (Ag) or Copper (Cu). The interposer 21 having such conductor columns 30 and 31 and wiring lines 32 is suited for a high speed.

Here in this embodiment, the center distance 37 between the adjacent lower face pads 29 and 29 is set larger than that 36 between the adjacent upper face pads 28 and 28, but their size relation should not be limited thereto. For example, both the center distance 37 between the adjacent lower face pads 29 and 29 and the center distance 36 between the adjacent upper face pads 28 and 28 may be set to the same value (e.g., about 200 microns). In this case, the wiring group such as the wiring lines 32 may be omitted.

Here will be described a procedure for manufacturing the semiconductor package structure 11 thus constructed.

The interposer 21 is manufactured through the following procedure, for example. First of all, two green alumina sheets having a thickness of about 0.15 mm are prepared (at a not-sintered member preparing step). The via holes (or the through holes) are formed in the grid shape through the green alumina sheet at predetermined positions. The via holes (or the through holes) are formed by the drilling, punching or laser working method, for example. The via holes (or the through holes) may be formed simultaneously as the individual green alumina sheets are formed. Whatever method is used, according to this embodiment, the hole forming work is performed at the stage of the not-sintered member so that the performance can be made more easily and at a lower cost than the method performing the work at the stage of the sintered member.

Next, a screen printing apparatus is used to print a tungsten paste (or a paste containing a conductive metal) known in the art, thereby to fill the via holes with the tungsten paste (at a metal filling step). After this metal filling step, the tungsten paste is printed on the green alumina sheet (at a metal layer forming step). As a result, a paste-printed layer to become the wiring lines 32 later is formed in a predetermined pattern on the surface of one green alumina sheet, and a paste-printed layer to become the lower face pads 29 later is formed on the back. Moreover, a printed-paste layer to become the upper face pads 28 later is formed on the surface of the other green alumina sheet.

Next, the two green alumina sheets are laminated and subjected to a pressing force in the thickness direction so that they are integrated to form a green alumina sheet laminate (at a laminating step). At this time, the printed paste to become the wiring lines 32 later is arranged at the inner layer. Next, the green alumina sheet laminate is transferred to a firing furnace and heated to thousand and several hundreds ° C. thereby to sinter the alumina and the tungsten in the paste (at a simultaneous firing step). Moreover, a well-known solder material (such as solder material of Sn/Ag=96.5/3.5) is printed over the upper face pads 28 and the lower face pads 29 and is then subjected to a reflow. As a result, the upper face solder bumps 26 of a predetermined height are formed over the upper face pads 28, and the lower face solder bumps 27 having a larger height are formed over the lower face pads 29 (at a bump forming step). As a result, there is obtained the interposer 21, as shown in FIG. 1 and FIG. 5.

Next, the IC chip 15 is placed on the upper face 22 of the interposer 21 completed. At this time, the facial connection terminals 16 on the side of the IC chip 15 and the upper face solder bumps 26 on the side of the interposer 21 are registered with each other. Then, the upper face solder bumps 26 and the facial connection terminals 16 are jointed to each other by heating and causing the individual upper face side solder bumps 26 to reflow.

Next, the resin filler 81 is applied to the upper face 22 of the interposer 21 by means of the well-known dispenser (although not shown). Then, the interposer 21 and the IC chip 15 are filled inbetween with the resin filler 81, and the upper face solder bumps 26 are fixed by the resin filler 81.

After this, the resin filler 8 is set at a temperature of about 120° C.

As a result, there is completed the interposer 61 with the IC chip, as shown in FIG. 7. However, the resin filler 81 is omitted from FIG. 7 and FIG. 8.

Next, the wiring substrate 41 is prepared in advance, and the well-known solder material is printed to reflow on the facial connection pads 46 thereby to form the substrate side solder bumps 49. Next, the lower face solder bumps 27 on the side of the interposer 21 and the substrate side solder bumps 49 on the facial connection pads 46 are registered with each other (as referred to FIG. 8), and the interposer 61 with the IC chip is placed on the wiring substrate 41. Then, the lower face bumps 27 and the facial connection pads 46 are jointed to each other.

After this, the resin filler 82 (although not shown) is applied to the upper face 42 of the wiring substrate 41 by means of the well-known dispenser (although not shown). Then, the interposer 21 and the wiring substrate 41 are filled inbetween with the resin filler 82, and the lower face solder bumps 27 and the substrate side solder bumps 49 are fixed by the resin filler 82.

After this, the resin filler 82 is set at a temperature of about 120° C.

As a result, there is completed the semiconductor package structure 11, as shown in FIG. 4.

Thus, the following effects can be obtained according to this embodiment.

(1) The IC chip 15 (or the semiconductor element) and the interposer body 38 (or the intermediate substrate body) are filled inbetween with the resin filler 81, or the wiring substrate 41 (or the substrate) and the interposer body 38 (or the intermediate substrate body) are filled inbetween with the resin filler 82. This construction relaxes the thermal stress at the mounted portion between the IC chip 15 and the wiring substrate 41 (or the substrate) (that is, between the IC chip 15 and the interposer body 38 or between the wiring substrate 41 and the interposer body 38). Therefore, it is possible to provide a structure which is excellent in the connection reliability and which is composed of the semiconductor element, the intermediate substrate and the substrate. It is also possible to provide the intermediate substrate with the semiconductor element and the substrate with the intermediate substrate, which are suitable for realizing the aforementioned excellent substrate.

On the other hand, the plane (or the free space) capable of applying the resin filler 81 is retained not around all the four sides of the IC chip 15 but only around the side of a portion of the IC chip 15. Therefore, the resin filler 81 applied does not flow around the IC chip 15.

As a result, the resin filler 81 does not surround the four sides of the IC chip 15 so that any cavity can be reliably prevented from being formed in the resin filler 81 between the IC chip 15 and the intermediate substrate 21. It is also possible to prevent any crack or the like from being formed in the joint portion between the IC chip 15 and the interposer 21.

(2) In this semiconductor package structure 11 (or the structure), the center distance 37 between the adjacent lower face pads 29 and 29 is set larger than the center distance 36 between the adjacent upper face pads 28 and 28. This setting makes it possible to form the lower side solder bumps 27 of a more solder quantity and a larger size easily over the lower face side. Therefore, the interposer 21 can be relatively easily manufactured. In this case, it is possible to set a larger center distance between facial connection pads 46 corresponding to the lower face pads 29. Therefore, the substrate side solder bumps 49 of a more solder quantity and a larger size can be easily formed over the facial connection pads 46 on the side of the wiring substrate 41. Therefore, the wiring substrate 41 can be relatively easily manufactured. Moreover, the yield of the wiring substrate 41 is improved to lower the percent defective thereby to lower the cost for the semiconductor package structure 11.

Moreover, the solder bumps 26 and 49 of desired sizes can be formed over the lower face pads 29 and the facial connection pads 46 so that the interposer 21 and the wiring substrate 41 can be firmly jointed through the solder. Therefore, it is possible to give a high connection reliability between the interposer 21 and the wiring substrate 41.

This semiconductor package structure 11 (or the structure) is constructed by using the substantially plate-shaped interposer body 38 made of alumina. This construction reduces the difference in the thermal expansion coefficient between the interposer 21 and the IC chip 15. Therefore, a high thermal stress does not act directly on the IC chip 15. Therefore, any crack or the like hardly occurs in the interface between the IC chip 15 and the interposer 21 even if the IC chip 15 is large-sized to have a high caloric power. Therefore, a high reliability can be given to the chip joint portion or the like thereby to realize the semiconductor package structure 11, which is excellent in the connection reliability and the durability. Moreover, the alumina is a less expensive ceramic material than silicon nitride or the like, and tungsten is a conductive metal material of a generally wide use. The combination of these materials can realize the relatively inexpensive interposer 21 and semiconductor package structure 11.

(4) This embodiment adopts the simultaneous firing method as one for sintering the tungsten contained in the paste. Therefore, the number of steps can be relatively small to manufacture the interposer 21 accordingly efficiently at a lower cost.

Here, the embodiment of the invention may be modified in the following manner.

For example, the semiconductor package structure 11 (or the structure) may be manufactured by the following method. As shown in FIG. 9, a wiring substrate 71 with an interposer (or a substrate with an intermediate substrate) is prepared beforehand by jointing the interposer 21 to the upper face 42 of the wiring substrate 41 with solder.

After this, the resin filler 82 (although not shown) is applied to the upper face 42 of the wiring substrate 41 by means of the well-known dispenser (although not shown). Then, the lower face solder bumps 27 and the substrate side solder bumps 49 are filled inbetween with the resin filler 82 so that the lower face solder bumps 27 and the substrate side solder bumps 49 are fixed by the resin filler 82.

After this, the resin filler 82 is set at a temperature of about 120° C.

After this, the IC chip 15 is jointed to the upper face 22 of the wiring substrate 71 with the interposer. Next, the resin filler 81 (although not shown) is applied to the upper face 22 of the interposer 21 by means of the well-known dispenser (although not shown). Then, the interposer 21 and the IC chip 15 are filled inbetween with the resin filler 81 so that the upper face solder bumps 26 are fixed by the resin filler 81.

After this, the resin filler 81 is set at a temperature of about 120° C.

As a result, the desired semiconductor package structure 11 is manufactured (as referred to FIG. 4).

In the semiconductor package structure 11 of the aforementioned embodiment, the interposer 21 is constructed by using the interposer body 38 of the two-layered structure but may be constructed by using an interposer body of a multi-layered structure of three or more layers. On the contrary, the interposer 21 may also be constructed by using not the multi-layered structure but an interposer body of a single-layered structure.

In the aforementioned embodiment, the wiring lines group is formed only in the inner layer of the interposer body 38. However, the invention should not be limited thereto but may be exemplified by the mode, in which the wiring lines group is formed in the inner layer and in the upper face 22, in which the wiring lines group is formed in the inner layer and in the lower layer 23, or in which the wiring lines group is formed in the inner layer, in the upper face 22 and in the lower face 23.

Figure 12:
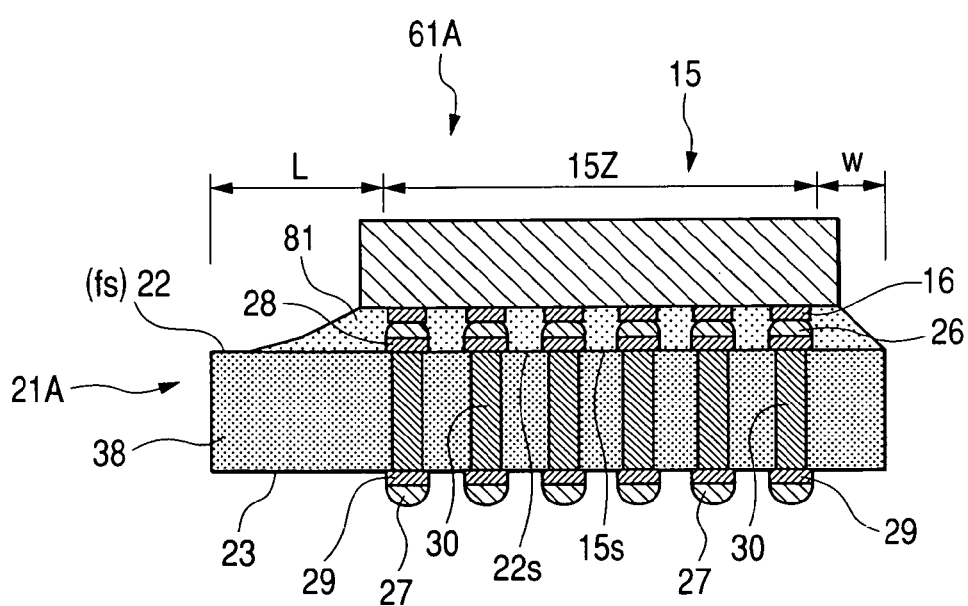
FIG. 12 is a sectional view taken along line Y-Y of FIG. 11.

FIG. 11 and FIG. 12 are a top plan view showing such an interposer (or an intermediate substrate) 61A with the IC chip (or the semiconductor element) 15 as is different from the aforementioned one, and a sectional view of the interposer 61A taken along line Y-Y of FIG. 11.

As shown in FIG. 11 and FIG. 12, the IC chip 15 is mounted over the semiconductor element mounting area 15Z which has the center 15s offset rightward from the center 22s of the upper face 22 of the interposer 21A. As shown in FIG. 11, more specifically, planes having the width w narrower than the width (L) of the free space fs having the width of 2 mm or less (e.g., 1.3 mm or 1.5 mm) are formed between the upper, lower and right sides of the IC chip 15 having a square shape of 10 mm×10 mm in the top plan view and the adjacent sides of the upper face 22 of the interposer 21A. At the same time, the free space fs having the length L of about 6 mm is formed between the left side of the IC chip 15 and the left side of the upper face 22.

Moreover, the facial connection terminals 16 of the IC chip 15 are connected like before through the solder bumps 26 with the first face terminals 28 which are positioned within the mounting area 15Z in the upper face 22 of the interposer 21A.

The upper face 22 of the interposer 21A and the IC chip 15 are filled inbetween with the resin filler 81 like the aforementioned one thereby to seal up the connected portions. When the resin filler 81 is applied to the free space fs on the upper face 22 from the not-shown dispenser, more specifically, it flows due to its fluidity (or viscosity) along the individual sides of the upper face 22 toward the semiconductor mounting area 15Z. At this time, the planes between the area 15Z and the upper, lower and right sides of the upper face 22 are so narrow as to have the width w of 2 mm or less (e.g., 1.3 mm or 1.5 mm). Therefore, the resin filler 81 flows around those planes and advances homogeneously between the first plane terminals 28, the solder bumps 26 and the facial connection terminals 16 so that it is solidified in the shape, as shown in FIG. 12.

As a result, it is possible to provide the interposer 61A with the IC chip 15, in which the connected portions composed of a plurality of sets of the first face terminals 28, solder bumps 26 and facial connection terminals 16 are sealed up with the resin filler 81 having no cavity in its inside, as shown in FIG. 12.

Figure 13:
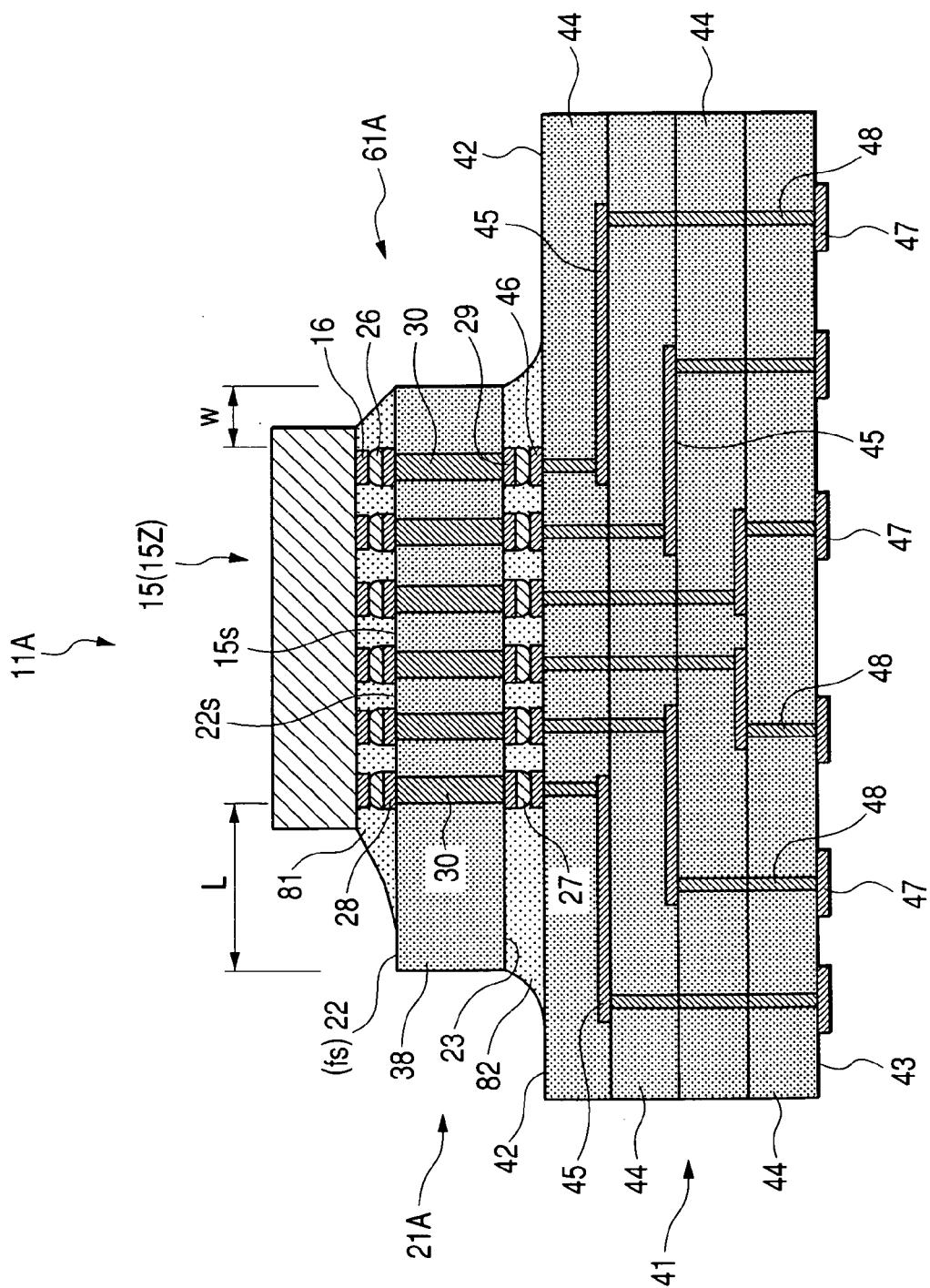
FIG. 13 is a sectional view showing a structure, in which an intermediate substrate with the semiconductor element is mounted on the upper face of the wiring substrate.

As shown in FIG. 13, moreover, the interposer 61A with the IC chip 15 may also be mounted like before on the upper face 42 of the wiring substrate 41 Specifically, a semiconductor package structure 11A like before can also be formed, as shown in FIG. 13, by connecting the second face terminals 29 located on the lower face 23 of the interposer 21 and the facial connection pads 46 located on the upper face 42 of the wiring substrate 41 through the solder bumps 27 and by filling their surroundings with the resin filler 82.

In addition to the technical concept disclosed in the "SUMMARY OF THE INVENTION", here will be enumerated the portions of the technical concept, as preferable aspects of the invention, to be grasped by the foregoing embodiments (the invention is not limited only to those twelve aspects).

(1) An intermediate substrate, wherein first face bumps are formed on the surfaces of the plural first face terminals, and wherein second face bumps are formed on the surfaces of the plural second face terminals.

(2) An intermediate substrate, wherein first face bumps are formed on the surfaces of the plural first face terminals, and wherein second face bumps containing more solder than that of the first face solder bumps are formed on the surfaces of the plural second face terminals.

(3) An intermediate substrate, wherein the wiring line group is arranged in the inner layer of the intermediate substrate body.

(4) An intermediate substrate, wherein the wiring line group is arranged only in the inner layer of the intermediate substrate body.

(5) An intermediate substrate, wherein the intermediate substrate body is made of a laminated sintered ceramic member of a structure having a plurality of laminated sheets of an insulating ceramic material, and wherein the wiring line group is arranged in the inner layer of the laminated sintered ceramic member.

(6) An intermediate substrate, wherein the intermediate substrate body has a thickness of 0.1 mm or more and 0.7 mm or less.

(7) An intermediate substrate, wherein the intermediate substrate body has a thickness of 0.1 mm or more and 0.3 mm or less.

(8) An intermediate substrate, wherein the semiconductor element has at least one side of 10.0 mm or more.

(9) An intermediate substrate, wherein the semiconductor element has a thickness of 1.0 mm or less.

(10) An intermediate substrate comprising: a substantially plate-shaped intermediate substrate body having a first face, on which a semiconductor element having a thermal expansion coefficient of 2.0 ppm/° C. or more and 5.00 ppm/° C. or less and facial connection terminals are mounted, and a second face, and made of a laminated and sintered ceramic member of a structure having a plurality of laminated sheets of an insulating ceramic material; a plurality of first face terminals arranged on the side of the first face; a plurality of second face terminals arranged on the side of the second face; first face solder bumps formed on the surfaces of the plural first face terminals; second face solder bumps formed on the surfaces of the plural second face terminals and having a more solder quantity than that of the first face solder bumps; a plurality of conductor columns disposed in the intermediate substrate body and extending in the intermediate substrate thickness direction; and a wiring lines group made of a plurality of wiring lines so disposed in the inner layer of the intermediate substrate body as to extend in the facial direction of the intermediate substrate and connected with the conductor columns, and having fan-out portions, in which the spacing between the adjacent wiring lines is enlarged, wherein the first face terminals and the second face terminals are made conductive through the plural conductor columns and the wiring line group, and wherein the center distance between the adjacent second face terminals is set larger than that between the adjacent first face terminals.

(11) A method for manufacturing the intermediate substrate, comprising: the non-sintered ceramic member preparing step of preparing a non-sintered ceramic member having a plurality of through holes; the metal filling step of filling the plural through holes with a conductive metal; the metal layer forming step of forming a layer of a conductive metal into a predetermined pattern over the surface of the non-sintered ceramic member; and the simultaneous firing step of heating and sintering the non-sintered ceramic member and the conductive metal.

(12) A method for manufacturing the intermediate substrate, comprising: the non-sintered ceramic member preparing step of preparing a non-sintered ceramic member having a plurality of through holes; the metal filling step of filling the plural through holes with a conductive metal; the metal layer forming step of forming a layer of a conductive metal into a predetermined pattern over the surface of the non-sintered ceramic member; the laminating step of laminating and integrating the non-sintered ceramic member having passed through the metal filling step and the metal layer forming step, into a plurality of sheets with the layer of the conductive metal being arranged in the inner layer, thereby to form a non-sintered laminated member; and the simultaneous firing step of heating and sintering the non-sintered ceramic member and the conductive metal.

This application is based on Japanese Patent application JP 2003-179722, filed Jun. 24, 2003, the entire content of which is hereby incorporated by reference, the same as if set forth at length.

What is claimed is:

1. An intermediate substrate comprising:
an intermediate substrate body containing an insulating material, and having a first face to be mounted with a semiconductor element and a second face opposing to said first face; and
a semiconductor element mounting area including a plurality of first face terminals arranged on said first face, and being surrounded by an outermost periphery of said plurality of first face terminals,
wherein a center of said semiconductor element mounting area is eccentric with respect to a center of said first face;
wherein said center of said semiconductor element mounting area is positioned on a line extending through said center of said first face and parallel to at least one of sides defining said first face, and is offset from a center of said first face;
wherein, of widths of four planes which are formed around said semiconductor element mounting area and which are formed between four sides to form said semiconductor element and corresponding four sides to form said first face, a width of a plane for applying a resin filler to fill between a semiconductor element to be mounted and said intermediate substrate body is made larger than widths of remaining three planes adjacent and opposed to said plane; and
wherein the widths of the remaining three planes are each 2 mm or less.

2. The intermediate substrate according to claim 1, wherein a plurality of second face terminals are so arranged in said second face that positions of said second face terminals and positions of said first face terminals conducting with said second face terminals are offset along a direction perpendicular to a thickness direction of said intermediate substrate body.

3. The intermediate substrate according to claim 2, wherein a quantity of solder of second face solder bumps to be formed over said second face terminals is more than that of first face solder bumps to be formed over said first face terminals.

4. The intermediate substrate according to claim 1, wherein said intermediate substrate body has a thermal expansion coefficient being an intermediate value between those of said semiconductor element and said substrate.

5. The intermediate substrate according to claim 1, wherein said intermediate substrate body has a thermal expansion coefficient of from 2.0 to 8.0 ppm/° C.

6. The intermediate substrate according to claim 1, wherein said intermediate substrate body contains an inorganic material.

7. The intermediate substrate according to claim 1, wherein said intermediate substrate body contains ceramics.

8. The intermediate substrate according to claim 1, wherein said first face terminals have a diameter of 125 microns or less.

9. The intermediate substrate according to claim 1, wherein a center distance between adjacent ones of said first face terminals is 250 microns or less.

10. The intermediate substrate according to claim 1, wherein said intermediate substrate body has a thickness of from 0.1 to 0.7 mm.

11. The intermediate substrate according to claim 1, wherein said intermediate substrate body has a bending elastic modulus of 200 MPa or more.

12. An intermediate substrate having a semiconductor element, comprising a semiconductor element including an intermediate substrate and facial connection terminals,
wherein said intermediate substrate includes:
a substantially plate-shaped intermediate substrate body containing an insulating material, and having a first face to be mounted with said semiconductor element and a second face opposing to said first face; and
a semiconductor element mounting area including a plurality of first face terminals arranged on a side of said first face and being surrounded by an outermost periphery of said plurality of first face terminals; a plurality of second face terminals arranged on a side of said second face; and conductor structures disposed in said intermediate substrate body for conducting said first face terminals and said second face terminals with each other,
wherein a center of said semiconductor element mounting area is eccentric with respect to a center of said first face,
said semiconductor element and said intermediate substrate body are filled inbetween with a resin filler,
two opposed ones of sides perpendicular to a thickness direction of said semiconductor element have individual lengths substantially equal to or smaller within a range of 4 mm or less than that of such two ones of sides perpendicular to a thickness direction of said intermediate substrate body as correspond to said opposed two sides of said semiconductor element, and
remaining two opposed ones of sides perpendicular to a thickness direction of said semiconductor element have individual lengths smaller by 4 mm or more than that of such two ones of sides perpendicular to a thickness direction of said intermediate substrate body as correspond to said remaining opposed two sides of said semiconductor element.

13. A substrate having an intermediate substrate, comprising a substrate including said intermediate substrate according to claim 1 and facial connection pads,
wherein said intermediate substrate includes:
a substantially plate-shaped intermediate substrate body containing an insulating material, and having a first face to be mounted with said semiconductor element and a second face to be mounted on a surface of said substrate; and
a plurality of first face terminals arranged on a side said first face; a plurality of second face terminals arranged on a side of said second face; and conductor structures disposed in said intermediate substrate body for conducting said first face terminals and said second face terminals with each other,
said substrate and said intermediate substrate body are filled inbetween with a resin filler,
two opposed ones of sides perpendicular a thickness direction of said semiconductor element to be mounted have individual lengths substantially equal to or smaller within a range of 4 mm or less than that of such two ones of sides perpendicular to a thickness direction of said intermediate substrate body as correspond to said opposed two sides of said semiconductor element, and
remaining two opposed ones of sides perpendicular to a thickness direction of said semiconductor element to be mounted have individual lengths smaller by 4 mm or more than that of such two ones of sides perpendicular to a thickness direction of said intermediate substrate body as correspond to said remaining opposed two sides of said semiconductor element.

14. A structure including a semiconductor element, an, intermediate substrate and a substrate, comprising: an intermediate substrate; a semiconductor element having facial connection terminals; and a substrate having facial connection pads,
wherein said intermediate substrate includes:
a substantially plate-shaped intermediate substrate body containing an insulating material, and having a first face to be mounted with said semiconductor element and a second face opposing to said first face and to be mounted on a surface of said substrate; and
a semiconductor element mounting area including a plurality of first face terminals arranged on a side of said first face, and being surrounded by an outermost periphery of said plurality of first face terminals;
a plurality of second face terminals arranged on a side of said second face; and conductor structures disposed in said intermediate substrate body for conducting said first face terminals and said second face terminals with each other,
wherein a center of said semiconductor element mounting area is eccentric with respect to a center of said first face,
said semiconductor element and said intermediate substrate body are filled inbetween with a resin filler,
said substrate and said intermediate substrate body are filled inbetween with a resin filler,
wherein two opposed ones of sides perpendicular to a thickness direction of said semiconductor element have individual lengths substantially equal to or smaller within a range of 4 mm or less than that of such two ones of sides perpendicular to a thickness direction of said intermediate substrate body as correspond to said opposed two sides of said semiconductor element, and
remaining two opposed ones of sides perpendicular to a thickness direction of said semiconductor element have individual lengths smaller by 4 mm or more than that of such two ones of sides perpendicular to a thickness direction of said intermediate substrate body as correspond to said remaining opposed two sides of said semiconductor.

* * * * *